United States Patent
Lu

(10) Patent No.: US 10,761,927 B2
(45) Date of Patent: Sep. 1, 2020

(54) DETECTION AND CORRECTION OF DATA BIT ERRORS USING ERROR CORRECTION CODES

(71) Applicant: Taiwan Semiconductor Manufacturing Co., Ltd., Hsinchu (TW)

(72) Inventor: Shih-Lien Linus Lu, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 44 days.

(21) Appl. No.: 16/128,967

(22) Filed: Sep. 12, 2018

(65) Prior Publication Data

US 2020/0019456 A1 Jan. 16, 2020

Related U.S. Application Data

(60) Provisional application No. 62/698,658, filed on Jul. 16, 2018.

(51) Int. Cl.
*G06F 11/10* (2006.01)

(52) U.S. Cl.
CPC ........ *G06F 11/102* (2013.01); *G06F 11/1048* (2013.01)

(58) Field of Classification Search
CPC .......................... G06F 11/1048; G06F 11/102
See application file for complete search history.

(56) References Cited

U.S. PATENT DOCUMENTS

| 9,411,683 | B2 * | 8/2016 | Kwok | G06F 11/1076 |
| 2010/0042906 | A1 * | 2/2010 | Gunnam | H03M 13/1111 |
| | | | | 714/780 |
| 2019/0068219 | A1 * | 2/2019 | Bhatia | G11C 29/42 |

OTHER PUBLICATIONS

Gill, John, "EE387—Algebraic Error Control Codes, Class Notes," Stanford University, Oct. 9, 2015, https://web.stanford.edu/class/ee387/handouts/notes09.pdf; 16 pages.

* cited by examiner

*Primary Examiner* — Guy J Lamarre
(74) *Attorney, Agent, or Firm* — Sterne, Kessler, Goldstein & Fox P.L.L.C.

(57) ABSTRACT

A method of correcting one or more bit errors in a memory device includes retrieving a codeword from a memory device. The codeword includes a data and an error correcting code. The method further includes determining whether the one or more bit errors are present in the retrieved codeword and correcting the retrieved codeword for the one bit error in response to determining one bit error is present in the retrieved codeword. The method also includes flipping a bit of the retrieved codeword in response to determining a plurality of bit errors is present in the retrieved codeword and correcting the retrieved codeword for the plurality of bit errors based on the bit-flipped codeword.

20 Claims, 9 Drawing Sheets

DETECTION AND CORRECTION OF DATA BIT ERRORS USING ERROR CORRECTION CODES

CROSS-REFERENCE TO RELATED APPLICATIONS

This application claims priority of U.S. Provisional Patent Application No. 62/698,658, titled "Detection and Correction of Data Bit Errors using Error Correction Codes," filed Jul. 16, 2018, the disclosure of which is incorporated by reference in its entirety.

BACKGROUND

Digital systems (e.g., computer systems) often include one or more data storage systems for reading and/or writing data. In some instances, electrical and/or magnetic interferences inside the digital systems corrupt the stored data in the one or more data storage systems. The data may also become corrupted while being transmitted through noisy communication channels in the digital systems during processing and the corrupted data is stored in the one or more data storage systems. For the detection and/or correction of such corrupted data, error correction code (ECC) based systems and methods may be implemented in the one or more data storage systems.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
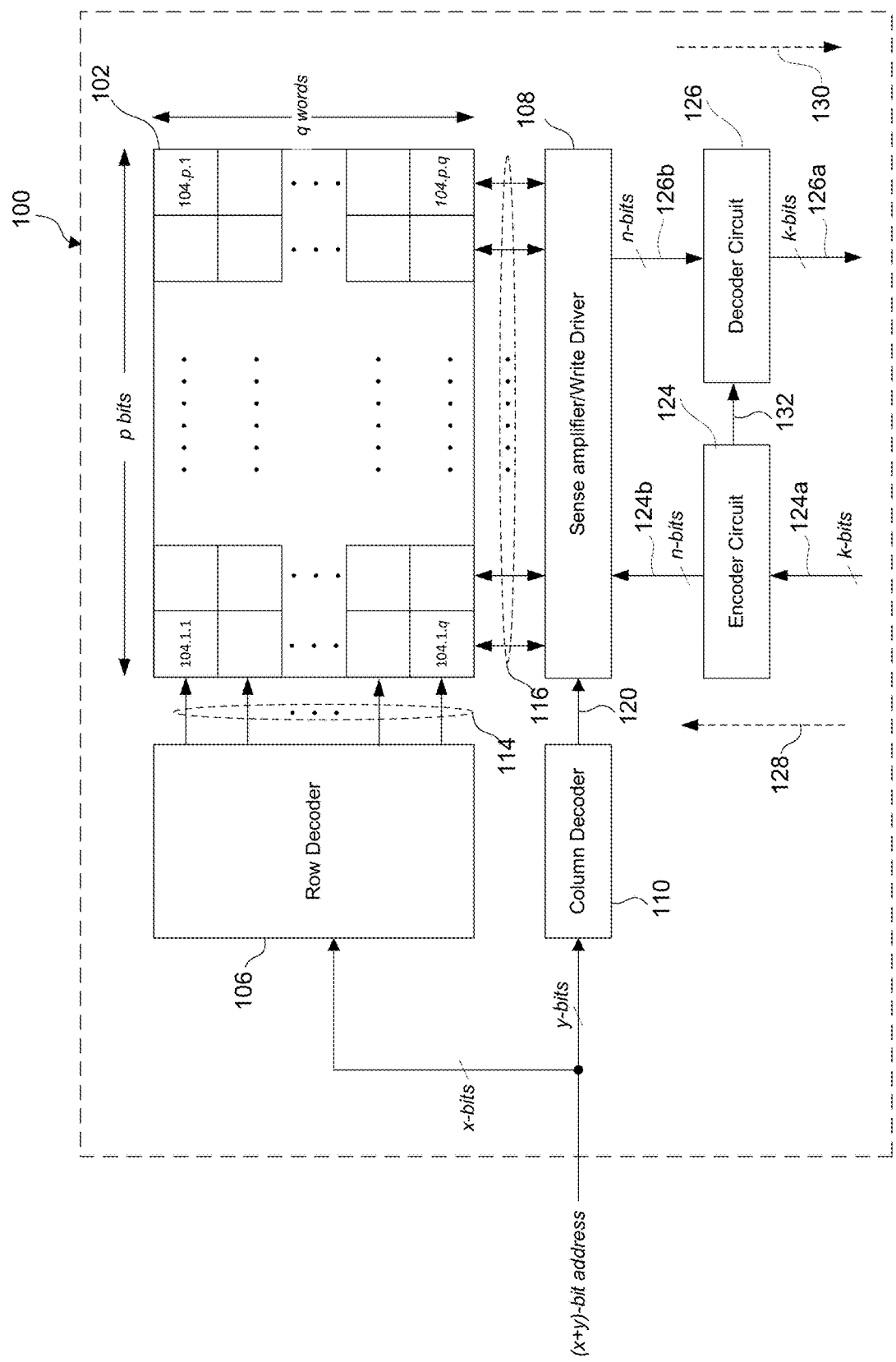
FIG. 1 illustrates a block diagram of a data storage system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "substantially" indicates the value of a given quantity varies by ±5% of the value.

A data storage system includes one or more memory devices having memory cells that are usually arranged in a 2-dimensional array. Each memory cell can typically store one bit of data by holding or not holding a charge in, for example, a capacitor. The presence or absence of a charge indicates, for example, logic 1 when a charge is stored, and logic 0 when no charge is stored. Electrical or magnetic disturbance, such as interference from noise or radiation, can change the contents of one or more memory cells and/or interfere with the circuitry used to read and write data to the memory cells and cause the stored data to be corrupted. To ensure the integrity of data stored in and read from the data storage system and transmitted between various parts of the system, it is desirable to detect and correct the corrupted stored data. Many current data storage systems use ECC-based systems and methods for bit error detection and correction.

However, the aggressive scaling down of memory devices in semiconductor technology has led to increasingly complex logic circuitry in the ECC-based systems of current data storage systems. Such logic circuitry has resulted in increasingly longer circuit propagation delays, and consequently, longer processing time and higher power consumption for the operations of the ECC-based systems. Also, the increased complexity of the ECC-based systems is susceptible to hardware errors in its logic circuitry, which can lead to higher bit error rates in the current ECC-based data storage systems.

The present disclosure provides example ECC-based systems and methods for the detection and correction of single and multi-bit errors in memory devices that help to overcome the above discussed problems in current ECC-based data storage systems. The example ECC-based methods disclosed herein help to reduce the complexity of logic circuitry used for the implementation of the disclosed example ECC-based bit error detection and correction (BEDC) circuits in data storage systems. The example methods disclosed herein for bit error detection and correction help to keep the logic circuitry of the BEDC circuits as simple as possible so as to avoid errors that may occur in the circuit and also to be able to operate the logic circuitry as quickly as possible for faster bit error detection and correction compared to current bit error detection and correction methods. Lowering the complexity of the logic circuitry helps to reduce the number of devices used in the implementation of the logic circuitry, and consequently, helps to reduce the integrated circuit layout area, power consumption, propagation delays, and processing times of the logic circuitry compared to current ECC-based BEDC circuits. In some embodiments, the processing times required for the operations of the example ECC-based BEDC circuits may be reduced by about 10% to about 50% compared to processing times of current ECC-based BEDC circuits.

FIG. 1 illustrates a block diagram of a data storage system 100, according to some embodiments. Data storage system 100 may be implemented as a volatile memory, such as random access memory (RAM), which requires power to maintain the data or non-volatile memory, such as read-only memory (ROM), which maintains the data even when not powered. The RAM may be implemented as dynamic random-access memory (DRAM), static random-access memory (SRAM), and/or non-volatile random-access memory (NVRAM), such as flash memory to provide an example. In some embodiments, data storage system 100 may be implemented as a portion of an integrated circuit device, for example, a logic device (such as, a microcontroller, microprocessor or the like) or a portion of a memory device. In some embodiments, the lines connecting each block of FIG. 1 may represent parallel data buses. The number adjacent to a slash across the data bus may indicate the number of data lines in the bus.

Data storage system 100 may include a memory array 102, a row decoder 106, a sense amplifier/write driver 108, a column decoder 110, an encoder circuit 124, and a decoder circuit 126. Memory array 102 may include memory cells 104.1.1 through 104.$p.q$ that are arranged in an array of p columns and q rows. However, other arrangements for the memory cells 104.1.1 through 104.$p.q$ are possible without departing from the spirit and scope of this disclosure. In some embodiments, both p and q may be an integer greater than 1. In some embodiments, p and q may be equal or different from each other. Each of memory cells 104.1.1 through 104.$p.q$ may be connected to a corresponding word line (WL) from among WLs 114.1 through 114.$q$ and a corresponding bit line (BL) from among BLs 116.1 through 116.$p$. In some embodiments, memory cells 104.1.1 through 104.$p.q$ in each of the p columns of memory array 102 may share a common BL from among BLs 116.1 through 116.$p$. Similarly, memory cells 104.1.1 through 104.$p.q$ in each of q rows of memory array 102 share a common WL from among WLs 114.1 through 114.$q$. For example, as shown in FIG. 1, memory cells 104.1.1 through 104.$p.1$ of row 1 of memory array 102 share WL 114.1 and memory cells 104.$p.1$ through 104.$p.q$ of column p of memory array 102 share BL 116.$p$.

Data storage system 100 may operate in a first direction 128 to write data to one or more memory cells that are configured to form an array of memory cells of memory array 102 or in a second direction 130 to read data from the one or more memory cells. First direction 128 may also be referred to as a write mode of operation and second direction 130 may also be referred to as a read mode of operation. In the read mode of operation, data storage system 100 may read data from one or more memory cells corresponding to an (x+y)-bit address. Similarly, data storage system 100 may write data to one or more memory cells corresponding to an (x+y)-bit address in the write mode of operation.

In some embodiments, to select a particular memory cell from among memory cells 104.1.1 through 104.$p.q$ for a mode of operation, such as the read mode of operation or the write mode of operation, to provide some examples, the BL associated with the particular memory cell is selected, and the WL associated with this particular memory cell is selected. For example, BL 116.1 and WL 114.1 may be selected to select memory cell 104.1.1. Thereafter, data may be written into the selected memory cell in the write mode of operation, or data may be read from the selected memory cell in the read mode of operation.

In some embodiments, each of WLs 114.1 through 114.$q$ may be selectively asserted by applying a corresponding x-bit row address from among a corresponding (x+y)-bit address to row decoder 106. A data storage device controller, not shown in FIG. 1, may be used to provide the x-bit row address to data storage device 100. Row decoder 106 may be configured to decode the corresponding x-bit row address and provide one or more control signals to WLs 114.1 through 114.$q$ that correspond to the x-bit row address to select a row of memory cells from among memory cells 104.1.1 through 104.$p.q$. Similarly, each of BLs 116.1 through 116.$p$ may be selected by applying a corresponding y-bit column address from among the corresponding (x+y)-bit address to column decoder 110. Column decoder 110 may be configured to decode the y-bit column address and provide one or more control signals 120 to sense amplifier/write driver 108 that correspond to the y-bit column address. In some embodiments, sense amplifier/write driver 108 may select a column of memory cells from among memory cells 104.1.1 through 104.p.q that corresponds to the y-bit column address.

In some embodiments, sense amplifier/write driver 108, using a sense amplifier, may read the data from a corresponding one or more BLs from among BLs 116.1 through 116.p that corresponds to a selected one or more memory cells from among memory cells 104.1.1 through 104.p.q during the read mode operation to provide n bits of data 126a. Alternatively, sense amplifier/write driver 108, using a write driver, may receive n bits of data 124b and write the n bits of data 124b to corresponding BLs from among BLs 116.1 through 116.p that corresponds to a selected memory cell from among memory cells 104.1.1 through 104.p.q during the write mode of operation.

Memory array 102 may include encoder circuit 124 and decoder circuit 126 to ensure the integrity of data stored in memory cells 104.1.1 through 104.p.q, according to some embodiments. To ensure such integrity, the data received by memory array 102 may be encoded prior to being written in the one or more selected memory cells 104.1.1 through 104.p.q. during the write mode of operation and the stored encoded data in memory array 102 may be tested and corrected, if necessary, for bit errors before outputting from memory array 102 during the read mode of operation.

Encoder circuit 124 may be configured to receive data 124a having a bit length of k bits and to encode data 124a with an ECC to form codeword 124b (also referred as data 124b) having a bit length of n bits that may be written into the selected memory cell of memory array 102 during the write mode of operation, according to some embodiments. The ECC used to encode data 124a may be selected based on the desired number of bit errors to be detected and/or corrected. In some embodiments, the ECC used may detect multi-bit errors, but correct 1-bit error. In some embodiments, the ECC used may detect multi-bit errors, but correct 1-bit and 2-bit errors. In order to encode data 124a with an ECC, encoder circuit 124 may be configured to generate ECC bits (also referred to as check bits or redundant bits) having a bit length of n-k bits and to concatenate this (n-k)-bit ECC with k-bit data 124a to provide codeword 124b to sense amplifier/write driver 108 when operating in the write mode of operation. Each of the (n-k) bit of the ECC may be generated based on one or more subsets of the k-bit data 124a. Encoder circuit 124 and its configurations are further described with reference to FIGS. 2A-2B, according to some embodiments.

In some embodiments, both n and k may be an integer and n may be greater than k. In some embodiments, data 124a may represent one or more data in a data stream received by memory array 102. It will be understood that discussion with reference to data 124a may be applied to the one or more data received by and written in memory array 102 without departing from the spirit and scope of the present disclosure.

The ECC bits add redundancy to the stored data and allow one or more bit errors in the stored data to be detected and corrected, if necessary, during the read mode operation of memory array 102. In some embodiments, the ECC may include linear codes such as, for example, Hamming codes, Reed-Solomon codes, Bose-Chaudhuri-Bocquenghem (BCH) codes, Turbo codes, or Low Density Parity Check (LDPC) codes. In some embodiments, the ECC may be BCH codes that are a class of cyclic error-correcting codes constructed using polynomials over a finite field (Galois Field). In some embodiments, an advantage of BCH codes is that during code design, there is a precise control over the number of symbol errors correctable by the code. In particular, it is possible to design binary BCH codes that can correct multiple bit errors in the data stored in memory array 102. In some embodiments, another advantage of BCH codes is the ease with which they can be decoded, namely, via an algebraic method known as syndrome decoding. This may simplify the design of decoder circuit 126 using hardware.

In some embodiments, the bit length of the generated ECC may depend on the number of bit errors to be detected and corrected. For a k-bit data (e.g., data 124a), the number of ECC bits, x, needed to correct 1-bit error in the k-bit data needs to satisfy:

$$x >= \text{ceiling}[\log_2(k+x+1)] \quad \text{Equation (1)}$$

This equation (1) comes about because with x bits of ECC, $2^x$ different information may be encoded indicating the location of the bit error(s) in the k-bit data. The extra +1 in the above equation indicate the absence of a bit error. For example, for a 128-bit data, 8-bit ECC is needed to correct 1-bit error in the 128-bit data because the above equation (1) is satisfied, as ceiling[$\log_2(128+8+1)$]<8. However, if the number of ECC bits is 7, the above equation is not satisfied as ceiling[$\log_2(128+7+1)$]>7, and thus, the 7-bit ECC may not be able to correct 1-bit error in the 128-bit data. Furthermore, to correct each additional bit error, another x bits for the ECC are needed. For example, for a 128-bit data, 2*8 bit (i.e. 16 bit) ECC is needed to correct 2-bit errors in the 128-bit data because the above equation (1) is satisfied, as ceiling[$\log_2(128+16+)$]<16. Thus, the total bit length of a codeword (e.g., codeword 124b) formed from concatenation of k-bit data and x-bit ECC for binary data is denoted by n=k+x. In some embodiments, if the value of x is selected to correct 1-bit error in a data (e.g., data 124a), then this x-bit ECC can help to detect 2-bit errors and correct 1-bit error. For example, 8-bit ECC for 64-bit data (e.g., data 124a) may detect 2-bit errors and correct 1-bit error in the entire 72-bit codeword. This is known as a SECDED code, which is capable of single-error correcting (SEC) and double-error detecting (DED). In some embodiments, if the value of x is selected to correct 2-bit errors in a data (e.g., data 124a), then this x-bit ECC can help to detect 3-bit errors and correct 1-bit and 2-bit errors.

Decoder circuit 126 may be configured to receive codeword 126b (also referred as data 126b) having a bit length of n bits from a selected memory cell of memory array 102 during the read mode of operation, according to some embodiments. In some embodiments, decoder circuit 126 may be further configured to detect and correct, if necessary, single and/or multiple bit errors in codeword 126b prior to decoding and outputting k-bit data 126a. Codeword 126b may include k-bit data 126a' (not shown) and (n-k) bit ECC that was used to encode and store k-bit data 126a' received by memory array 102. Data 126a' may be similar to output data 126a if it was not corrupted while stored in memory array 102. In some embodiments, data 126a may be similar to data 124a and codeword 126b may be similar to codeword 124b if codeword 126b is not corrupted. In some embodiments, codeword 126b may represent codewords stored in one or more memory cells of memory array 102. It will be understood that discussion with reference to codeword 126b may be applied to other codewords read from the memory cells of memory array 102 without departing from the spirit and scope of the present disclosure.

In some embodiments, n-k ECC bits of codeword 126b may be for detection of single and multi-bit errors and correction of 1-bit error in codeword 126b. In this situation, decoder circuit 126 may be configured to detect the presence of 1-bit error, determine the location of the 1-bit error, and correct the 1-bit error in codeword 126b. In order to detect 1-bit error in codeword 126b, decoder circuit 126 may be configured to generate an (n-k)-bit syndrome S of codeword 126b and to determine if syndrome S is equal to zero. When syndrome S of codeword 126b is equal to zero, which may indicate that codeword 126b is bit error free, decoder 126 may be configured to separate the n-k ECC bits from codeword 126b and output data 126b that is similar to data 126b' in this bit error free situation. In this disclosure, syndrome equal to zero refers to all bits of syndrome being equal to zero, unless mentioned otherwise.

When syndrome S of codeword 126b is not equal to zero, which may indicate that there is a 1-bit error in codeword 126b, decoder circuit 126 may be configured to determine the location of the 1-bit error. To determine the location, decoder circuit 126 may be configured to sequentially flip each bit of codeword 126b to form new codewords, generate an (n-k)-bit syndrome S' for each of the new codewords after bit flipping, and determine if any of the syndromes S' of the new codewords are equal to zero. When one of the syndromes S' of the new codewords is equal to zero, this may indicate that the new codeword corresponding to the syndrome S' that is equal to zero has the information of the location of the 1-bit error in codeword 126b. In some embodiments, decoder circuit 126 may be configured to use this location information to correct the 1-bit error in codeword 126b, to separate the n-k ECC bits from the corrected codeword 126b, and to output data 126b that may be bit error free and uncorrupted. Decoder circuit 126 and its configurations for 1-bit error detection and correction are further described with reference to FIGS. 3A-3C and 4-7, according to some embodiments.

When none of the syndromes S' of the new codewords are equal to zero, this may indicate that there are multi-bit errors in codeword 126b. In this situation, decoder circuit 126 may be configured to separate the n-k ECC bits from the corrupted codeword 126b and to output a signal indicating the presence of uncorrectable multi-bit errors in data 126b.

In some embodiments, n-k ECC bits of codeword 126b may be for detection of single and multi-bit errors and correction of 1-bit and 2-bit errors in codeword 126b. In this situation, decoder circuit 126 may be configured to detect the presence of 1-bit and 2-bit errors, determine the location of the 1-bit and 2-bit errors, and correct the 1-bit and 2-bit errors in codeword 126b. In some embodiments, decoder circuit 126 may be configured to generate an (n-k)-bit syndrome S of codeword 126b and to determine if syndrome S is equal to zero. When syndrome S of codeword 126b is equal to zero, which may indicate that codeword 126b is bit error free, decoder 126 may be configured to separate the n-k ECC bits from codeword 126b and output data 126b that is similar to data 126b' in this bit error free situation.

When syndrome S of codeword 126b is not equal to zero, which may indicate that there are single or multi-bit errors in codeword 126b, decoder circuit 126 may be configured to detect the presence and location of 1-bit error in codeword 126b. In this situation, decoder circuit 126 may be configured to determine if syndrome S matches a predetermined value. When syndrome S matches the predetermined value, which may indicate the presence of 1-bit error in codeword 126b and provide the location of the 1-bit error, decoder circuit 126b may be configured to correct the 1-bit error in codeword 126b, to separate the n-k ECC bits from the corrected codeword 126b, and to output data 126b that may be bit error free and uncorrupted.

When syndrome S of codeword 126b does not satisfy the predetermined value, which may indicate that there are multi-bit errors in codeword 126b, decoder circuit 126 may be configured to determine the locations of the 2-bit errors in codeword 126b. To determine the locations, decoder circuit 126 may be configured to sequentially flip each bit of codeword 126b to form new codewords, generate an (n-k)-bit syndrome S' for each of the new codewords after bit flipping, and determine if any of the syndromes S' of the new codewords match the predetermined value. When one of the syndromes S' of the new codewords matches the predetermined value, which may indicate the presence of 2-bit errors in codeword 126b and provide the locations of the 2-bit errors, decoder circuit 126b may be configured to correct the 2-bit errors in codeword 126b, to separate the n-k ECC bits from the corrected codeword 126b, and to output data 126b that may be bit error free and uncorrupted. Decoder circuit 126 and its configurations for 1-bit and 2-bit error detection and correction are further described with reference to FIGS. 2 and 5-6, according to some embodiments.

When none of the syndromes S' of the new codewords matches the predetermined value, this may indicate that there are 3 or more bit errors in codeword 126b. In this situation, decoder circuit 126 may be configured to separate the n-k ECC bits from the corrupted codeword 126b and to output a signal indicating the presence of uncorrectable bit errors in data 126b.

The above described bit flipping configuration of decoder circuit 126 to determine the location of bit errors may help to reduce the complexity and processing time of decoder circuit 126 compared to decoder circuits used in current bit error detection circuits in data storage systems. Decoder circuit 126 and its configurations for 1-bit and 2-bit error detection and correction are further described with reference to FIGS. 2-6, according to some embodiments. In some embodiments, decoder circuit 126 may help to reduce the complexity of determining bit error locations through complex polynomial computations as used in current decoder circuits in data storage systems. In some embodiments, the processing times required for the operations of decoder circuit 126 may be reduced by about 10% to about 50% compared to processing times of current decoder circuits in ECC-based data storage systems.

While control signals and/or clock signals are not shown, it will be understood that data storage system 100 may receive such signals from one or more control circuits and/or reference clocks to control operation of the one or more component of data storage system 100.

Figure 2A:
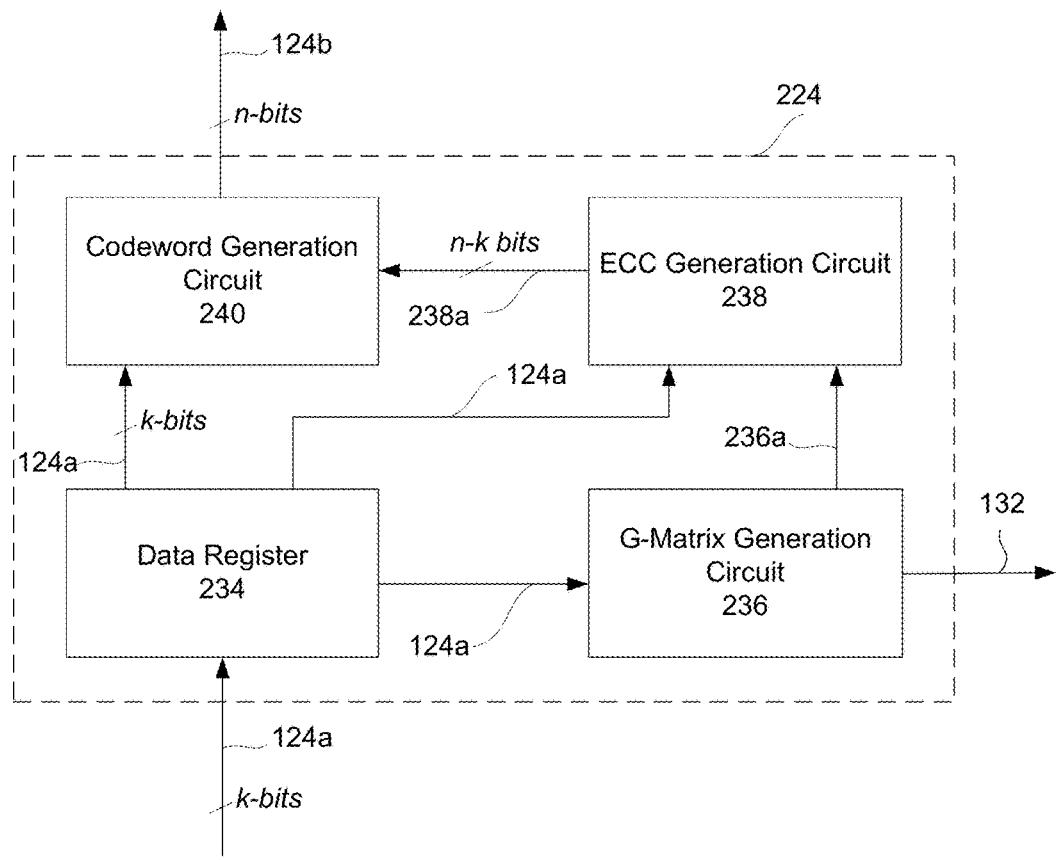
FIG. 2A illustrates a block diagram of an ECC-based encoder circuit, in accordance with some embodiments.

FIG. 2A illustrates a block diagram of an encoder circuit 224 that can be implemented as a part of data storage system 100, according to some embodiments. In some embodiments, encoder circuit 224 may be implemented as a part of encoder circuit 124. In some embodiments, encoder circuit 224 may represent encoder circuit 124. The above discussion of encoder circuit 124 and its configurations applies to encoder circuit 224 unless mentioned otherwise. In some embodiments, the lines connecting each block of FIG. 2A may represent parallel data buses. The number adjacent to a slash across the data bus may indicate the number of data lines in the bus.

Encoder circuit 224 may be configured to receive k-bit data 124a and to encode data 124a with n-k-bit ECC to form n-bit codeword 124b that may be written into the selected memory cell of memory array 102 during the write mode of operation. In some embodiments, encoder circuit 224 may include a data register 234, a G-matrix (also referred as generation matrix or generator matrix) generation circuit 236, an ECC generation circuit 238, and a codeword generation circuit 240. It will be understood that without departing from the spirit and scope of the present disclosure encoder circuit 224 may have other components (not shown) such as, but not limited to, control circuitry (e.g., clock circuitry, power circuitry) and/or control signals (e.g., clock signals) to control operations of one or more components (e.g., data register 234, G-matrix generation circuit 236, ECC bit generation circuit 238, codeword generation circuit 240) of encoder circuit 224. It will also be understood that without departing from the spirit and scope of the present disclosure encoder circuit 224 may receive control signals (e.g., clock signals) (not shown) to control operations of one or more components (e.g., data register 234, G-matrix generation circuit 236, ECC bit generation circuit 238, codeword generation circuit 240) of encoder circuit 224 from control circuitry (not shown) that may be implemented as a part of data storage system 100 and/or as a part of other components (e.g., decoder circuits 126, 226) of data storage system 100.

Data register 234 may be configured to receive and store data 124a. In some embodiments, data 124a may be temporarily stored in data register 234 until codeword 124b may be output from encoder circuit 224. As discussed above, codeword 124b may be formed from concatenation of n-k-bit ECC and k-bit data 124a. FIG. 2A illustrates exemplary circuitry for generation of codeword 124b from n-k-bit ECC 238a and k-bit data 124a. ECC 238a may be generated by ECC generation circuit 238 based on data 124a received from data register 234 and G-matrix 236a received from G-matrix generation circuit 236.

In some embodiments, G-matrix 236a may be generated by G-matrix generation circuit 236 based on data 124a received from data register 234. G-matrix 236a may be a matrix form of a generator polynomial g(x) over a finite field (e.g., Galois Field (GF)) as ECC 238a may be defined over elements of the finite field. In some embodiments, the finite field may be a GF ($2^m$) and ECC 238a may be defined over the elements of GF ($2^m$). The GF elements can be written as an m-bit binary vector. The entire GF($2^m$) may be one-to-one mapped to a binary space (0 to $2^m-1$). Thus, binary arithmetic operations may be performed on the GF elements. In some embodiments, the generator polynomial g(x) of a t-bit error correcting binary linear code (e.g., ECC 238a) of length $2^m-1$ may be the lowest-degree polynomial over GF(2) which has a, $\alpha^2, \alpha^3, \ldots, \alpha^{2t}$ as its roots, where $\alpha$ is a primitive element in GF($2^m$) and m is an integer greater or equal to 3.

In some embodiments, G-matrix generation circuit 236 may be configured to first generate a non-systematic matrix form of the generator polynomial g(x) and then generate G-matrix 236a in a systematic matrix form through linear transformations of the generated non-systematic matrix. The systematic form of G-matrix 236a that is output from G-matrix generation circuit 236 may include a parity matrix (P-matrix) of a dimension k by n-k and an identity matrix (I-matrix) of a dimension k by k, where n is the size of codeword 124b and k is the size of data 124a. As a result, G-matrix 236a may have a dimension of k by n, denoted as $G_{k \times n}$.

In some embodiments, ECC generation circuit 238 may be configured to receive G-matrix 236a from G-matrix generation circuit 236 and data 124a from data register 234. ECC generation circuit 238 may be further configured to generate and output ECC 238a based on dot product between data 124a and G-matrix 236a. In some embodiments, ECC 238a may be generated by ECC generation circuit 238 based on equation (2) below:

$$E = D \bullet P \quad \text{Equation (2)}$$

where E represents a bit vector of ECC 238a, D represents a bit vector of data 124a, P represents the P-matrix of G-matrix 236a, and the symbol "•" represents a dot operation.

Figure 2B:
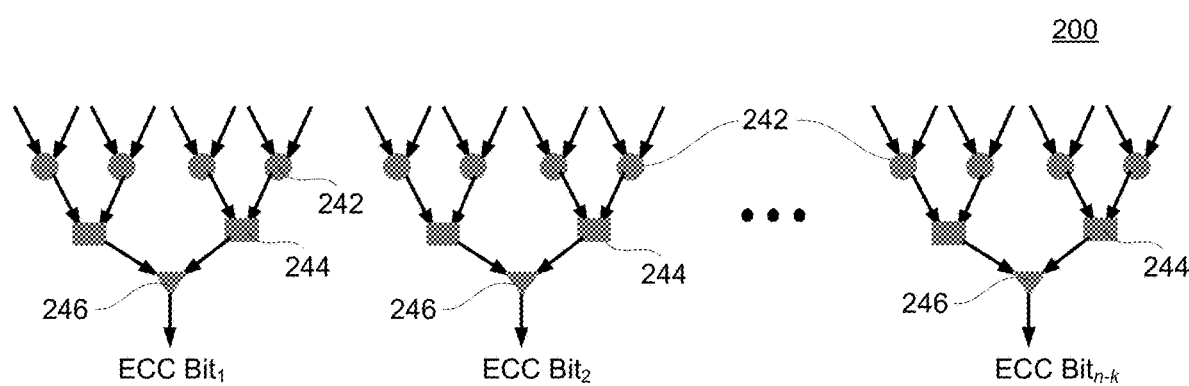
FIG. 2B illustrates an ECC bits generation circuit of an ECC-based encoder circuit, in accordance with some embodiments.

In some embodiments, ECC generation circuit 238 may include a plurality of XOR trees 200 (also referred as trees of XOR logic gates), as illustrated in FIG. 2B, to implement equation (2). Each XOR tree of the plurality of XOR trees 200 may output a bit of ECC 238a. As shown in FIG. 2B, each XOR tree of plurality of XOR trees 200 may include a plurality of XOR logic gates arranged in a logic tree architecture including a plurality of levels of XOR logic levels. In FIG. 2B, each of nodes 242, 244, and 246 of plurality of XOR trees 200 represents an XOR logic gate. In some embodiments, there may be a total of n-k XOR-trees 200 each with an average of k/2 nodes. Thus the depth of each of XOR trees 200 may be $\log_2 n$. Circular nodes 242, rectangular nodes 244, and triangular nodes 246 represent XOR logic level 1, 2, and 3 of plurality of XOR trees 200, respectively. It will be understood that XOR trees 200 may have more or less than 3 levels without departing from the spirit and scope of the present disclosure. Each node of each XOR logic level of XOR trees 200 may include a pair of inputs to receive the outputs from a pair of nodes of a preceding XOR logic level. The inputs of each node are represented by a pair of arrows going into the nodes and the outputs from each node are represented by an arrow going out of the nodes in FIG. 2B. The pair of inputs to each node of XOR trees 200 may include a pair of data bits of data 124a. The bit locations of these pairs of data bits correspond to the locations of non-zero data bit locations in P-matrix of G-matrix 236a.

In some embodiments, codeword generation circuit 240 may be configured to receive ECC 238a output from ECC generation circuit 238 and data 124a from data register 234. Codeword generation circuit 240 may be further configured to concatenate ECC 238a and data 124a to form and output n-bit codeword 124b that may be written into the selected memory cell of memory array 102 during the write mode of operation.

Figure 3A:
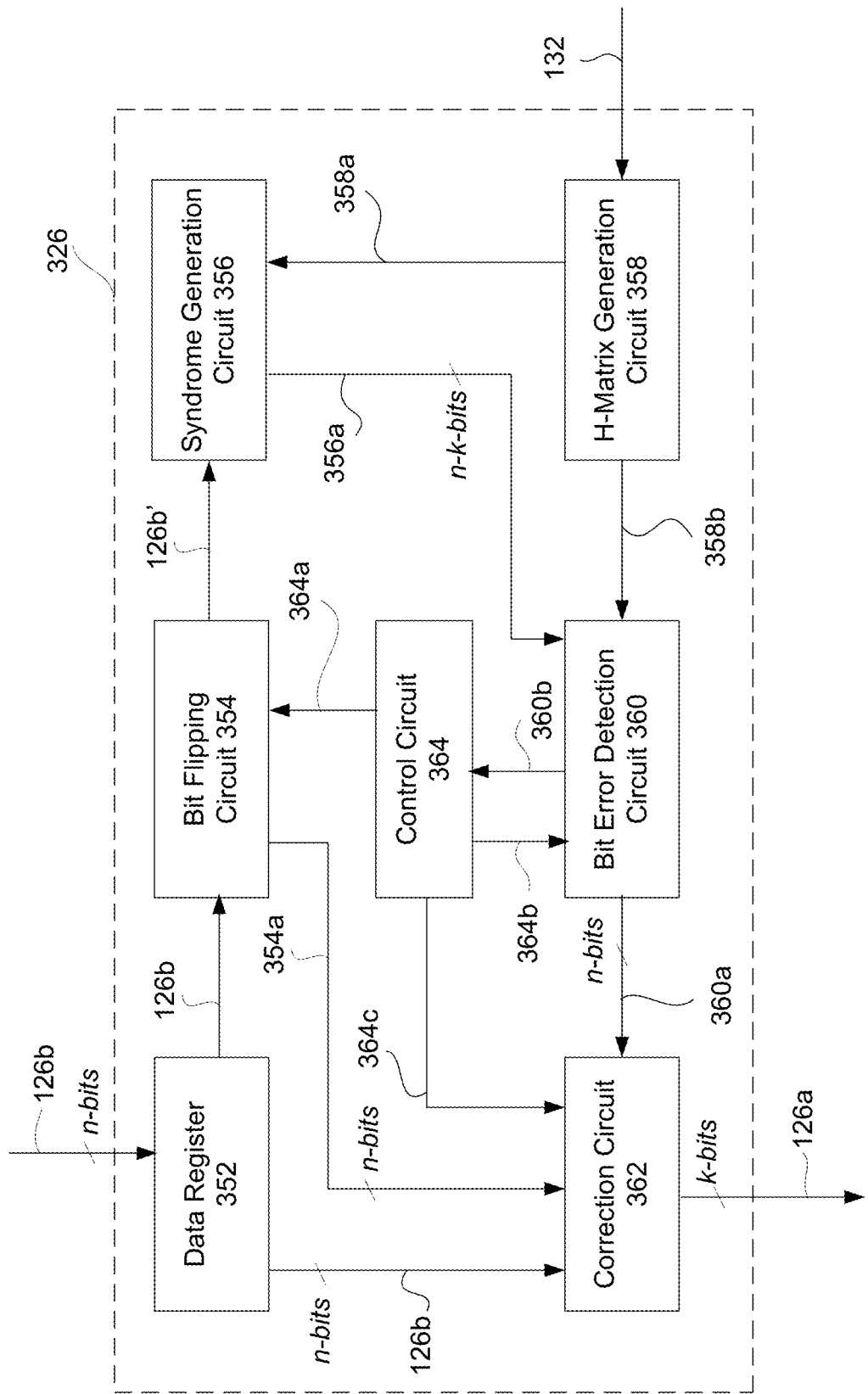
FIG. 3A illustrates a block diagram of an ECC-based decoder circuit, in accordance with some embodiments.

FIG. 3A illustrates a block diagram of a decoder circuit 326 that can be implemented as a part of data storage system 100, according to some embodiments. In some embodiments, decoder circuit 326 may be implemented as a part of decoder circuit 126. In some embodiments, decoder circuit 326 may represent decoder circuit 126. The above discussion of decoder circuit 126 and its configurations applies to decoder circuit 326 unless mentioned otherwise. In some embodiments, the lines connecting each block of FIG. 3A may represent parallel data buses. The number adjacent to a slash across the data bus may indicate the number of data lines in the bus.

Decoder circuit 326 may be configured to receive n-bit codeword 126b from a selected memory cell of memory array 102 during the read mode of operation, according to some embodiments. In some embodiments, decoder circuit 326 may be further configured to detect and correct, if necessary, single and/or multiple bit errors in codeword 126b prior to decoding and outputting k-bit data 126a. In some embodiments, decoder circuit 326 may include a data register 352, a bit flipping circuit 354, a syndrome generation circuit 356, an H-matrix (also referred as check matrix or parity-check matrix) generation circuit 358, bit error detection circuit 360, correction circuit 362, and a control circuit 364.

Data register 352 may be configured to receive and store codeword 126b. In some embodiments, codeword 126b may be temporarily stored in data register 352 until data 126a may be output from decoder circuit 326. Codeword 126b may include k-bit data 126a' (not shown) and (n-k)-bit ECC that was used to encode by an encoder circuit (e.g., encoder circuit 124 or 224) and store k-bit data 126a' (not shown) received by memory array 102. Data 126a' may be the original data of codeword 126b and may be similar to output data 126a if it was not corrupted while stored in memory array 102. In some embodiments, data 126a may be similar to data 124a and codeword 126b may be similar to codeword 124b if codeword 126b is not corrupted.

FIG. 3A illustrates exemplary circuitry for detection and correction of single and multiple bit errors in data (e.g., codeword 126b). In some embodiments, bit flipping circuit 354 may be configured to receive n-bit codeword 126b from data register 352 and to output, based on a control signal 364a received from control circuit 364, n-bit codeword 126b' (also referred as data 126b') that may be same as codeword 126b or that may have one bit different from codeword 126b. Codeword 126b' may be same as codeword 126b when control signal 364a disables bit flipping configuration of bit flipping circuit 354 during the steps of detecting the presence of bit errors in codeword 126b. Codeword 126b' may be different from codeword 126b by one bit when control signal 364a enables the bit flipping configuration of bit flipping circuit 354 during the steps of detecting the location of bit error(s) in codeword 126b. Bit flipping circuit 354 may be configured to flip one or more bits of codeword 126b during each iterative step of detecting the location of bit errors in codeword 126b. In some embodiments, bit flipping circuit 354 may be configured to flip one bit of codeword 126b consecutively during each iterative step of detecting the location of bit error(s) in codeword 126b.

Figure 3B:
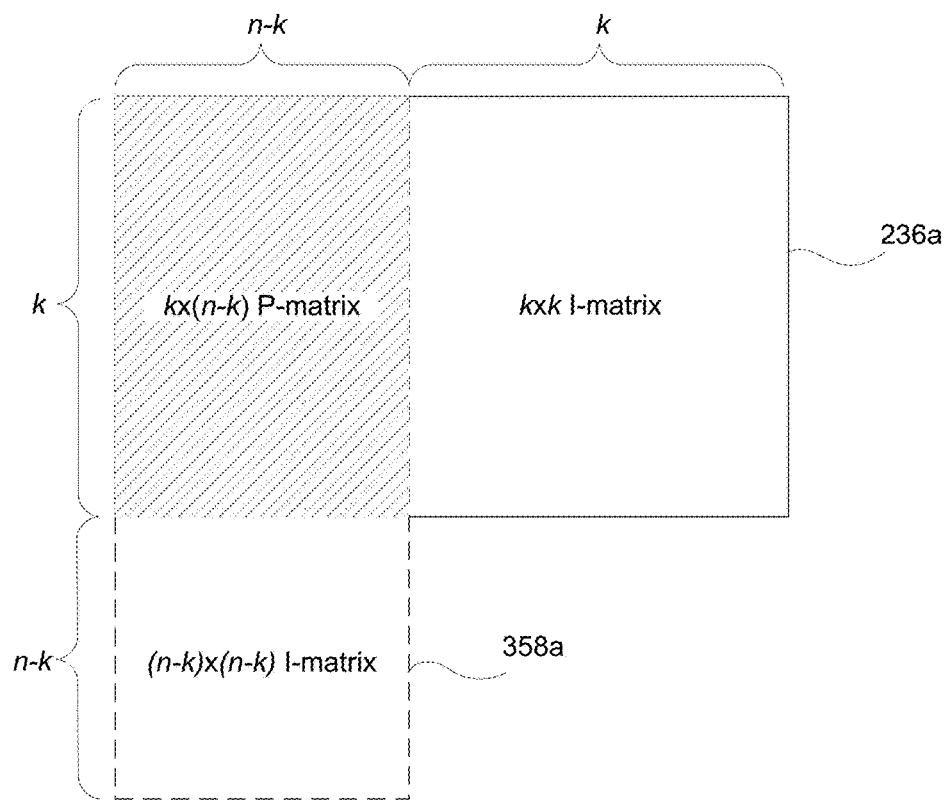
FIG. 3B illustrates a relationship between a generation matrix (G-matrix) and a check-matrix (H-matrix) of an ECC-based data storage system, in accordance with some embodiments.

In some embodiments, syndrome generation circuit 356 may be configured to receive codeword 126b' and transposed H-matrix 358a from H-matrix generation circuit 358. In some embodiments, H-matrix generation circuit 358 may be configured to receive information 132 from a G-matrix generation circuit such as G-matrix generation circuit 236 of encoder circuit 224. Information 132 may be G-matrix such as G-matrix 236a that may be used to generate and output transposed H-matrix 358a and H-matrix 358b by H-matrix generation circuit 358. In some embodiments, G-matrix 236a when in a systematic form may have a relationship with transposed H matrix 358a as illustrated in FIG. 3B. G-matrix 236a and transposed H-matrix 358a may share a P-matrix. H-matrix generation circuit 358 may generate transposed H matrix 358a having a dimension of n by (n−k) by taking the transpose of P-matrix of G-matrix 236a and concatenating the transposed P matrix with an identity matrix (I-matrix) of a dimension (n−k) by (n−k). H-matrix 358b may have a dimension of (n−k) by n. In some embodiments, transposed H-matrix 358a and H-matrix 358b may be in systematic form.

Referring back to FIG. 3A, syndrome generation circuit 356 may be further configured to generate and output (n−k)-bit syndrome 356a of codeword 126b' based on dot product between codeword 126b' and transposed H-matrix 358a. In some embodiments, (n−k)-bit syndrome 356a may be generated by syndrome generation circuit 356 based on equation (3) below:

$$S = C \cdot H^T \qquad \text{Equation (3)}$$

where S represents a bit vector of syndrome 356a, C represents a bit vector of codeword 126b', $H^T$ represents the transposed H-matrix 358a, and the symbol "•" represents a dot operation.

Figure 3C:
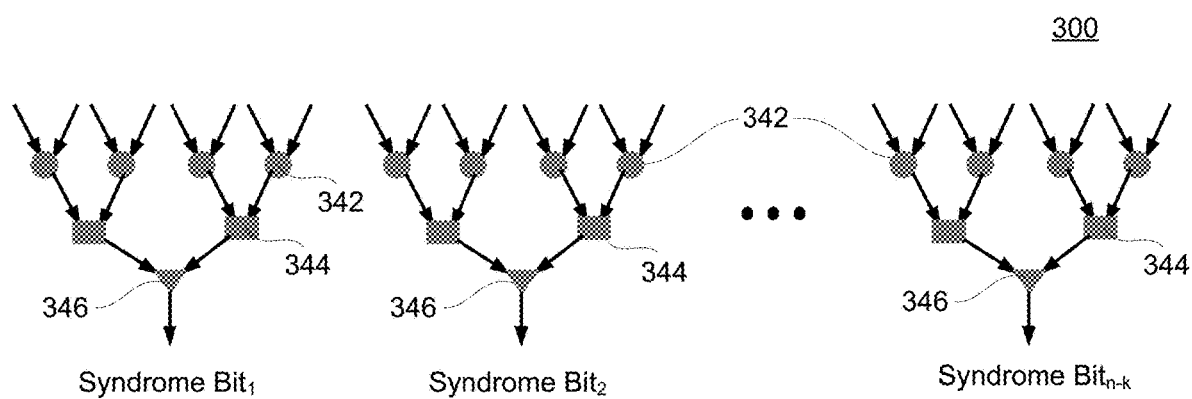
FIG. 3C illustrates a syndrome bits generation circuit of an ECC-based decoder circuit, in accordance with some embodiments.

In some embodiments, syndrome generation circuit 356 may include a plurality of XOR trees 300 (also referred as trees of XOR logic gates), as illustrated in FIG. 3C, to implement equation (3). Each XOR tree of the plurality of XOR trees 300 may output a bit of syndrome 356a. As shown in FIG. 3C, each XOR tree of plurality of XOR trees 300 may include a plurality of XOR logic gates arranged in a logic tree architecture including a plurality of levels of XOR logic levels. In FIG. 3C, each of nodes 342, 344, and 346 of plurality of XOR trees 300 represents an XOR logic gate. In some embodiments, there may be a total of n−k XOR-trees 300 each with an average of n/2 nodes. Thus the depth of each of XOR trees 300 may be $\log_2 n$. Circular nodes 342, rectangular nodes 344, and triangular nodes 346 represent XOR logic level 1, 2, and 3 of plurality of XOR trees 300, respectively. It will be understood that XOR trees 300 may have more or less than 3 levels without departing from the spirit and scope of the present disclosure. Each node of each XOR logic level of XOR trees 300 may include a pair of inputs to receive the outputs from a pair of nodes of a preceding XOR logic level. The inputs of each node are represented by a pair of arrows going into the nodes and the outputs from each node are represented by an arrow going out of the nodes in FIG. 3B. The pair of inputs to each node of XOR trees 300 may include a pair of data bits of codeword 126b'. The bit locations of these pairs of data bits correspond to the locations of non-zero data bit locations in transposed H-matrix 358a.

Referring back to FIG. 3A, in some embodiments, bit error detection circuit 360 may be configured to detect the presence of bit errors in codeword 126b, and to detect, if present, the location of bit errors in codeword 126b based on control signal 364b from control circuit 364 and/or on syndrome 356a received from syndrome generation circuit 356. In some embodiments, bit error detection circuit 360 may be configured to determine if syndrome 356a is equal to zero and based on this determination bit error detection circuit 360 may be configured to detect the presence of bit errors in codeword 126b. If syndrome 356a is determined to be equal to zero, bit error detection circuit 360 may be configured to provide a signal 360b to control circuit 364 indicating that codeword 126b is error free. Otherwise, bit error detection circuit 360 may be configured to provide signal 360b to control circuit 364 indicating that codeword 126b has one or more bit errors.

In some embodiments, bit error detection circuit 360 may be configured to determine if syndrome 356a is equal to a predetermined value and based on this determination bit error detection circuit 360 may be configured to detect the location of bit errors in codeword 126b. In some embodiments, the predetermined value may be a column of H-matrix 358b received from H-matrix generation circuit 358. Each column of H-matrix 358b may have n−k bits. If syndrome 356a is determined to be equal to or to match one of the columns of H-matrix 358b, bit error detection circuit 360 may be configured to provide signal 360b to control circuit 364 indicating that codeword 126b has a bit error at a bit location of codeword 126b that corresponds to the index of the matched column of H-matrix 358b. For example, if the third column of H-matrix 358b matches syndrome 356a, that is the bit vector of the third column of H-matrix 358b matches the bit vector of syndrome 356a, then the third bit location of codeword 126b has a bit error. Otherwise, bit error detection circuit 360 may be configured to provide signal 360b to control circuit 364 indicating that codeword 126b has a bit error at a different location.

In some embodiments, correction circuit 362 may be configured to output k-bit data 126a based on control signal 364c from control circuit 364. Correction circuit 362 may be configured to output data 126a based on control signal 364c if bit error detection circuit 360 provides signal 360b to control circuit 364 indicating that codeword 126b is error free. Otherwise, correction circuit 362 may be configured to correct codeword 126b based on control signal 364c, on bit error location(s) information 360a and/or 354a received from respective bit error detection circuit 360 and/or bit flipping circuit 354, and/or on codeword 126b received from data register 352 before outputting data 126a from control circuit 362 if bit error detection circuit 360 provides signal 360b to control circuit 364 indicating that codeword 126b has one or more bit errors. Data 126a may be the k-bit data portion of codeword 126b that is separated from the n−k bit ECC portion of codeword 126b by correction circuit 362 after receiving the error free signal 364c from control circuit 364 or after correcting codeword 126b. Data 126a may be the original k-bit data portion of codeword 126b that was stored in memory array 102 if it is output by correction circuit 362 after receiving the error free signal 364c or it may be the k-bit data portion of corrected codeword 126b if it is output by correction circuit 362 after correcting codeword 126b.

In some embodiments, control circuit 364 may be configured to control operations of other components of decoder circuit 326 besides circuits 354, 360, and 362 as described here. Control signals (e.g., 364a-c) from control circuit 364 may be in the form of clock signals, voltage signals, current signals, digital signals, or a combination thereof. In some embodiments, control circuit 364 may be implemented external to decoder circuit 326. It will be understood that without departing from the spirit and scope of the present disclosure decoder circuit 326 may have other components (not shown) besides control circuit 364 to control operations of one or more components of decoder circuit 326. It will also be understood that without departing from the spirit and scope of the present disclosure decoder circuit 326 may receive control signals (e.g., clock signals, voltage signals, current signals, digital signals, or a combination thereof) (not shown) to control operations of one or more components of decoder circuit 326 from control circuitry (not shown) that may be implemented as a part of data storage system 100 and/or as a part of other components (e.g., encoder circuits 124, 224) of data storage system 100.

Figure 4:
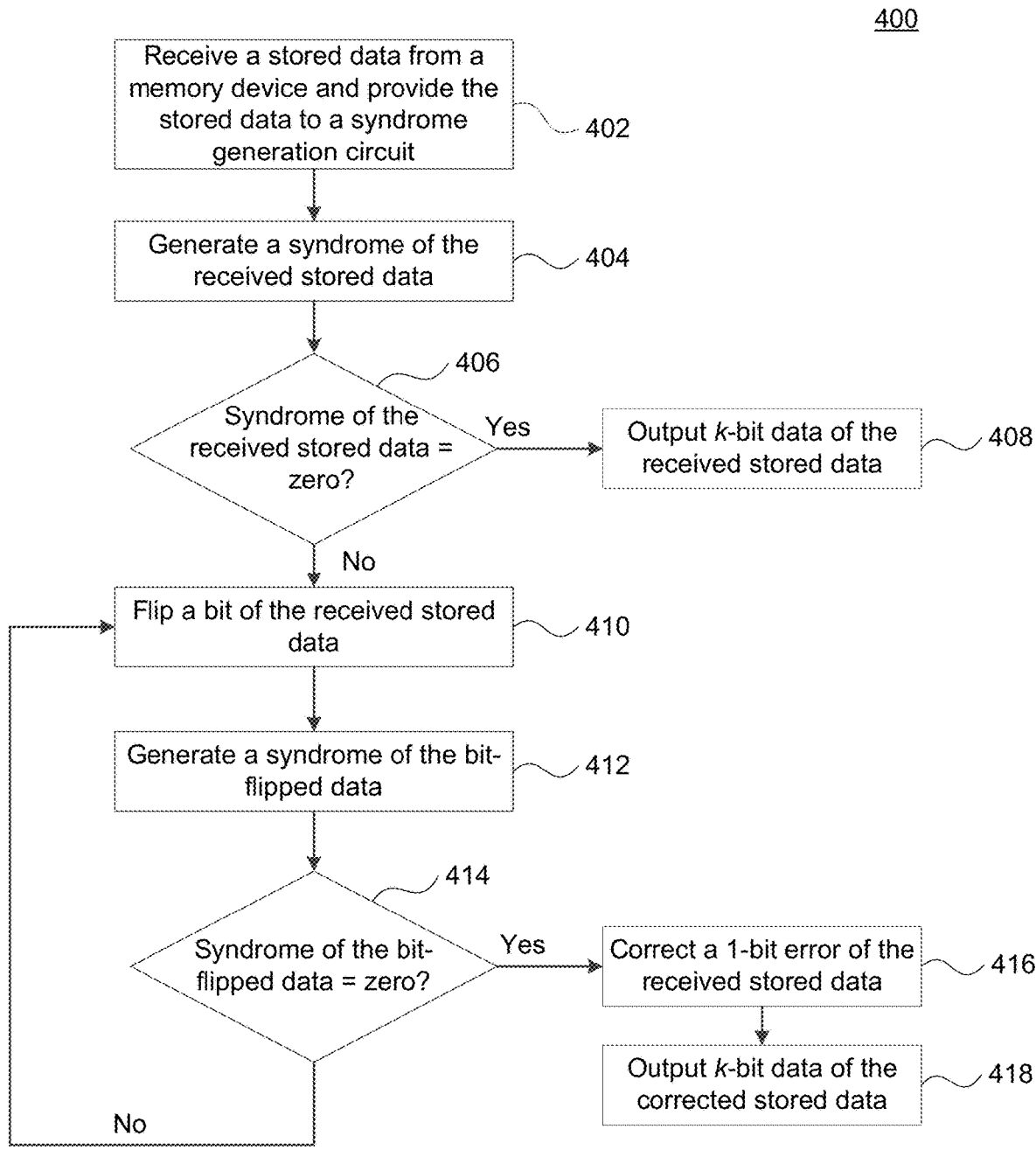
FIG. 4 is a flow diagram of an ECC-based method for detecting a multi-bit error and correcting a single bit error, in accordance with some embodiments.

FIG. 4 is a flow diagram of an example method 400 for detecting 1-bit and 2-bit errors and correcting 1-bit errors in data (e.g., data 124b or 126b) stored in a memory device (e.g., memory array 102) using a decoder circuit (e.g., decoder circuits 126, 326, and/or 526), according to some embodiments. Operations can be performed in a different order or not performed depending on specific applications. For illustrative purposes, some of the operations illustrated in FIG. 4 will be described with reference to devices and circuits illustrated in FIGS. 1, 2A-2B, 3A-3C, and 5.

Figure 5:
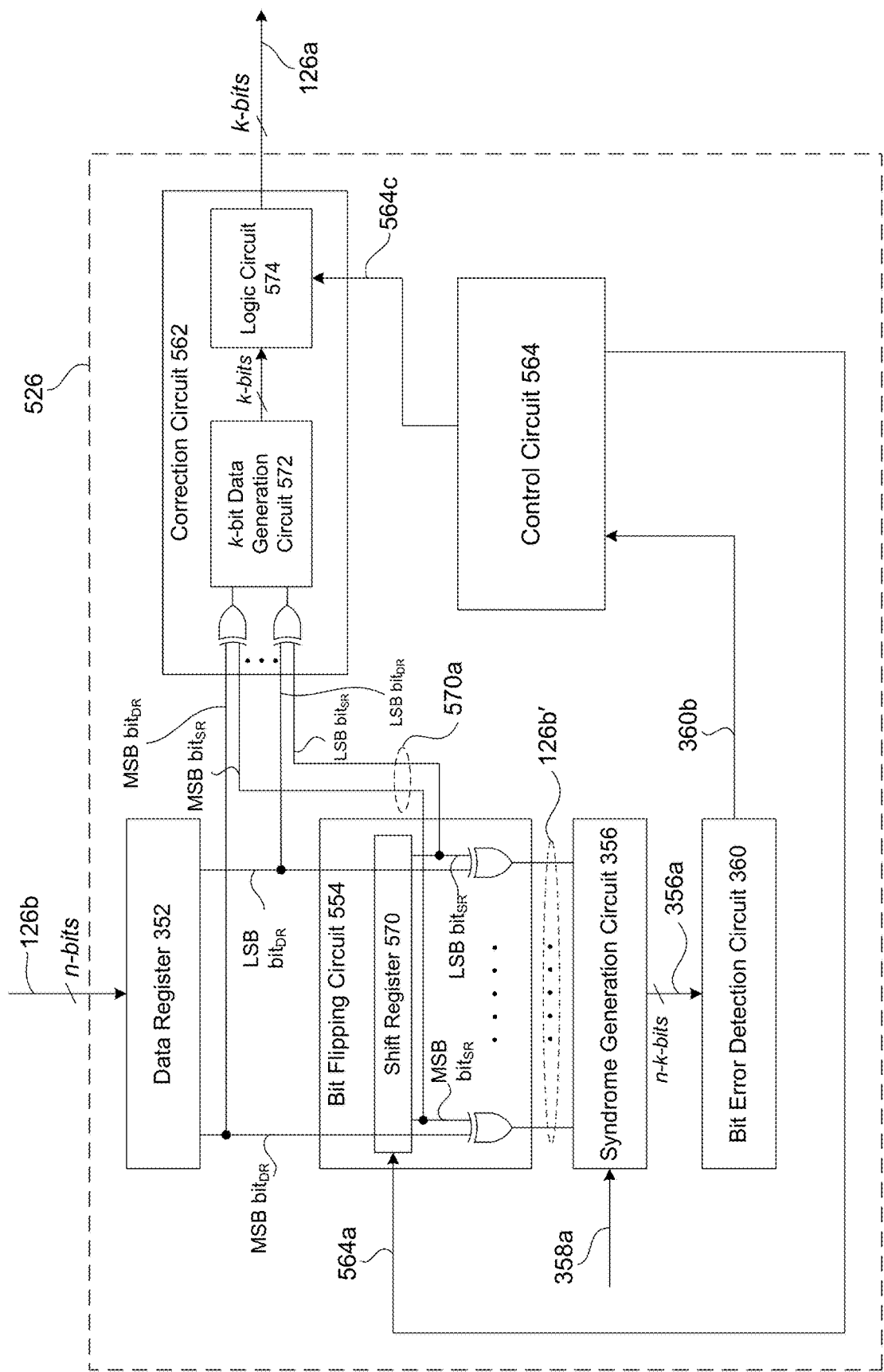
FIG. 5 is a block diagram of an ECC-based bit error detection and correction circuits, in accordance with some embodiments.

FIG. 5 illustrates a block diagram of a decoder circuit 526 that can be implemented as a part of data storage system 100, according to some embodiments. In some embodiments, decoder circuit 526 may represent decoder circuits 126 and/or 326. The above discussion of decoder circuits 126 and 326 and their elements and configurations applies to decoder circuit 526 unless mentioned otherwise. In some embodiments, decoder circuit 526 may include data register 352, bit flipping circuit 554, syndrome generation circuit 356, H-matrix generation circuit 358 (not shown in FIG. 5), bit error detection circuit 360, correction circuit 562, and control circuit 564. Elements in FIG. 5 with the same annotations as elements in FIG. 3A are described above. The above discussion of bit flipping circuit 354, control circuit 364, correction circuit 362, control signals 364a-c, and information 354a applies to bit flipping circuit 554, control circuit 564, correction circuit 562, control signals 564a-c, and information 570a, respectively, unless mentioned otherwise.

In some embodiments, method 400 may be an operational flow of decoder circuits 126, 326, and/or 526. It should be noted that method 400 does not describe overall operation of decoder circuits 126, 326, and/or 526. Accordingly, it is understood that additional operations may be provided during method 400, and that some other operations may only be briefly described herein.

In referring to FIG. 4, in operation 402, a stored data is received from a memory device and provided to a syndrome generation circuit. For example, as shown in FIG. 5, codeword 126b may be received by data register 352 of decoder circuit 526 from memory array 102 and codeword 126b' equal to codeword 126b may be provided to syndrome generation circuit 356. In some embodiments, providing codeword 126b' equal to codeword 126b to syndrome generation circuit 356 may include initializing shift register 570 of bit flipping circuit 554 to zero, that is, setting all bits of shift register 570 to logical values of zero based on control signal 564a received from control circuit 564. The providing may further include performing a bitwise logical XOR operation between codeword 126b and bits of shift register 570 as illustrated in FIG. 5. In some embodiments, shift register 570 may be a serial-in, parallel-out shift register having a bit length of n-bits.

In referring to FIG. 4, in operation 404, a syndrome of the received stored data is generated. For example, as shown in FIG. 5, syndrome 356a may be generated by syndrome generation circuit 356 based on codeword 126b received in operation 402 and on transposed H-matrix 358a received from H-matrix generation circuit 358 (shown in FIG. 3A). In some embodiments, the generation of syndrome 356a may include performing dot product between codeword 126b received in operation 402 and transposed H-matrix 358a based on equation (3) described above with reference to FIG. 3A. The generation may further include performing logical XOR operations between codeword 126b and transposed H-matrix 358a as described above with reference to FIGS. 3A and 3C.

In referring to FIG. 4, in operation 406, the generated syndrome of the received stored data is compared to zero. For example, as shown in FIG. 5, syndrome 356a may be provided to bit error detection circuit 360 that may be configured to compare syndrome 356a to zero. In some embodiments, the comparing may include performing a logical OR operation of the n−k bits of syndrome 356a by bit error detection circuit 360. If the output (e.g., signal 360b) of the logical OR operation is a logical value of zero, which indicates that syndrome 356a is equal to zero, then method 400 may proceed to operation 408. Otherwise, if the output (e.g., signal 360b) of the logical OR operation is a logical value of one, which indicates that syndrome 356a is not equal to zero, then method 400 may proceed to operation 410. In some embodiments, the equivalence of syndrome 356*a* to zero indicates that codeword 126*b* is error free and the non-equivalence of syndrome 356*a* to zero indicates that codeword 126*b* may have a 1-bit error.

In referring to FIG. 4, in operation 408, k-bit data of the received stored data is output. For example, as shown in FIG. 5, data 126*a* may be output by correction circuit 562. In some embodiments, the outputting of data 126*a* from correction circuit 562 may include performing a bitwise logical XOR operation between codeword 126*b* and the initialized n-bits of shift register 570 of operation 402 followed by separation of k-bit data portion of codeword 126*b* from the n–k-bit ECC portion of codeword 126*b* by circuit 572. The outputting may further include receiving signal 360*b* by control circuit 564 from bit error detection circuit 360 indicating that syndrome 356*a* is equal to zero followed by control circuit 564 providing control signal 564*c* to logic circuit 574. Control signal 564*c* may enable logic circuit 574 to allow k-bit data portion from circuit 572 to be output from correction circuit 562. In some embodiments, control circuit 564 may be configured to provide signal 564*c* that disables logic circuit 574 when control circuit 564 receives signal 360*b* from bit error detection circuit 360 indicating that syndrome 356*a* is not equal to zero.

In referring to FIG. 4, in operation 410, a bit of the received stored data is flipped. For example, as shown in FIG. 5, a bit of codeword 126*b* may be flipped by bit flipping circuit 554 to output codeword 126*b'* that is different from codeword 126*b* by one bit. In some embodiments, the bit flipping may include performing a bitwise logical XOR operation (shown in FIG. 5) between codeword 126*b* and bits of shift register 570, where one of the bits of shift register 570 has a logical value of one and the other bits have logical values of zero. The location of the bit of shift register 570 having a logical value of one corresponds to the location of the bit of codeword 126*b* that may be flipped.

In some embodiments, operation 410 may be part of an iterative loop for determining the location of 1-bit error in codeword 126*b*. The iterative loop may comprise of operations 410-414. The first iteration may start with entering a logical value of one in the most significant bit (MSB) position of shift register 570 at operation 410. During each iteration, at operation 410, the logical value of one in shift register 570 may be shifted one bit position towards its least significant bit (LSB) position, while the rest of the bit positions of shift register 570 has logical values of zero. The last iteration may have the logical value of one in the LSB position of shift register 570 during operation 410. Accordingly, the first iteration may start with the MSB of codeword 126*b* flipped at operation 410 and the last iteration may have the LSB of codeword 126*b* flipped during operation 410. During each iteration, at operation 410, a consecutive bit of codeword 126*b* may be flipped corresponding to the bit position of the logical one in shift register 570. In some embodiments, the operation (e.g., shifting of the logical value of one) of shift register 570 may be based on control signal 564*a* from control circuit 564.

In referring to FIG. 4, in operation 412, a syndrome of the bit-flipped data is generated. For example, as shown in FIG. 5, syndrome 356*a* of codeword 126*b'* may be generated by syndrome generation circuit 356 based on codeword 126*b'* output at operation 410 and on transposed H-matrix 358*a* received from H-matrix generation circuit 358 (shown in FIG. 3A).). In some embodiments, the generation of syndrome 356*a* may include performing dot product between codeword 126*b'* output in operation 410 and transposed H-matrix 358*a* based on equation (3) described above with reference to FIG. 3A. The generation may further include performing logical XOR operations between codeword 126*b'* and transposed H-matrix 358*a* as described above with reference to FIGS. 3A and 3C.

In referring to FIG. 4, in operation 414, the generated syndrome of the bit-flipped data is compared to zero. For example, as shown in FIG. 5, syndrome 356*a* generated at operation 412 may be provided to bit error detection circuit 360 that may be configured to compare syndrome 356*a* to zero. In some embodiments, the comparing may include performing a logical OR operation of the n–k bits of syndrome 356*a* by bit error detection circuit 360. If the output (e.g., signal 360*b*) of the logical OR operation is a logical value of zero, which indicates that syndrome 356*a* is equal to zero, then method 400 may proceed to operation 416. Otherwise, if the output (e.g., signal 360*b*) of the logical OR operation is a logical value of one, which indicates that syndrome 356*a* is not equal to zero, then method 400 may proceed to operation 410.

In some embodiments, the equivalence of syndrome 356*a* generated at operation 412 to zero indicates that the flipped bit location of codeword 126*b'* that is output at operation 410 is the location of 1-bit error in codeword 126*b*. The non-equivalence of syndrome 356*a* generated at operation 412 to zero indicates that the flipped bit location of codeword 126*b'* that is output at operation 410 is not the location of 1-bit error in codeword 126*b*. In this non-equivalence situation, another iteration of the iterative loop of operations 410-414 is performed. The iterations of the iterative loop may be performed until syndrome 356*a* generated at operation 412 is found to be zero at operation 414. If syndrome 356*a* generated at operation 412 is not found to be zero at operation 414 after n number of iterations of the iterative loop, bit error detection circuit 360 may provide signal 360*b* to control circuit 564 indicating that codeword 126*b* has uncorrectable 2-bit errors.

In referring to FIG. 4, in operation 416, a 1-bit error of the received stored data is corrected. For example, as shown in FIG. 5, 1-bit error in data codeword 126*b* may be corrected based on codeword 126*b* received from data register 352 and on information 570*a* received from shift register 570 by correction circuit 562. In some embodiments, the correcting may include performing a bitwise logical XOR operation between codeword 126*b* and the logical values of n-bits of shift register 570 at operation 410 followed by separation of k-bit data portion of the corrected codeword 126*b* from the n–k-bit ECC portion of the corrected codeword 126*b* by circuit 572.

In referring to FIG. 4, in operation 418, k-bit data of the corrected stored data is output. For example, as shown in FIG. 5, data 126*a* may be output by correction circuit 562. In some embodiments, the outputting of data 126*a* from correction circuit 562 may include receiving signal 360*b* by control circuit 564 from bit error detection circuit 360 indicating that syndrome 356*a* generated at operation 412 is equal to zero followed by control circuit 564 providing control signal 564*c* to logic circuit 574. Control signal 564*c* may enable logic circuit 574 to allow the separated k-bit data portion from circuit 572 to be output from correction circuit 562. In some embodiments, control circuit 564 may be configured to provide signal 564*c* that disables logic circuit 574 when control circuit 564 receives signal 360*b* from bit error detection circuit 360 indicating that syndrome 356*a* generated at operation 412 is not equal to zero.

Figure 6:
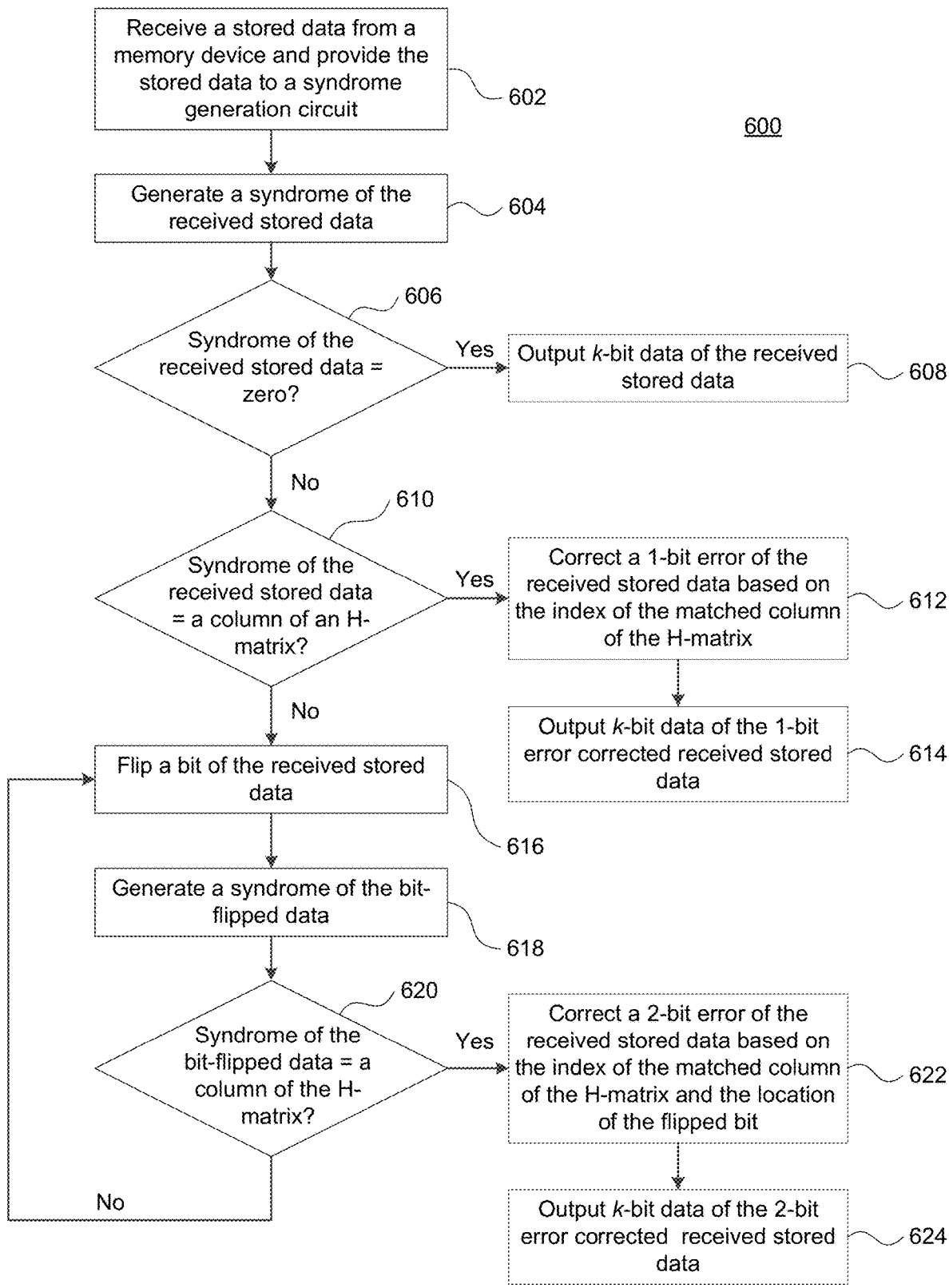
FIG. 6 is a flow diagram of an ECC-based method for detecting and correcting single-bit and multi-bit errors, in accordance with some embodiments.

FIG. 6 is a flow diagram of an example method 600 for detecting 1-bit and multi-bit errors and correcting 1-bit and 2-bit errors in data (e.g., data 124b or 126b) stored in a memory device (e.g., memory array 102) using a decoder circuit (e.g., decoder circuits 126, 326, and/or 726), according to some embodiments. Operations can be performed in a different order or not performed depending on specific applications. For illustrative purposes, some of the operations illustrated in FIG. 6 will be described with reference to devices and circuits illustrated in FIGS. 1, 2A-2B, 3A-3C, and 7.

Figure 7:
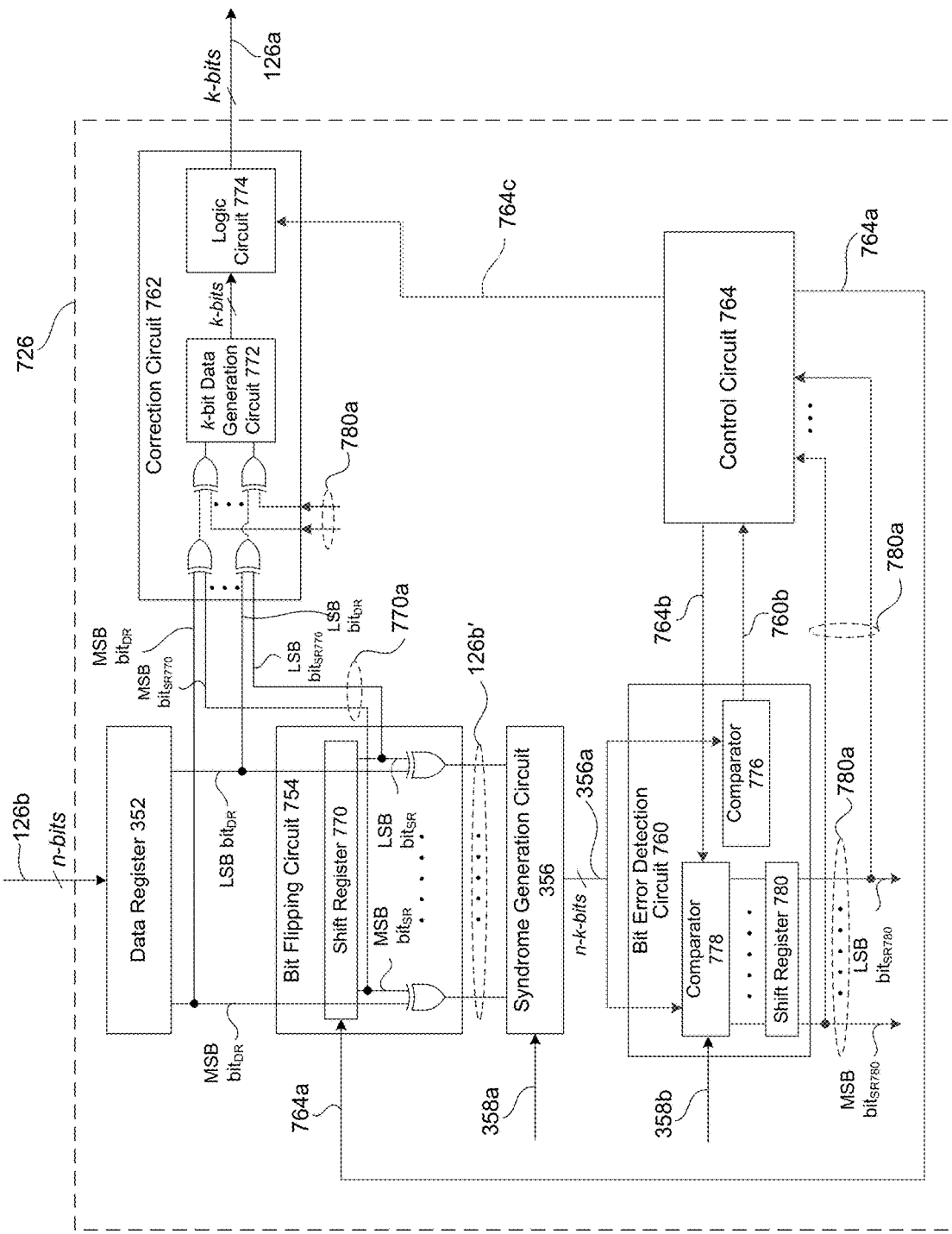
FIG. 7 is a block diagram of an ECC-based bit error detection and correction circuits, in accordance with some embodiments.

FIG. 7 illustrates a block diagram of a decoder circuit 726 that can be implemented as a part of data storage system 100, according to some embodiments. In some embodiments, decoder circuit 726 may represent decoder circuits 126 and/or 326. The above discussion of decoder circuits 126 and 326 and their elements and configurations applies to decoder circuit 726 unless mentioned otherwise. In some embodiments, decoder circuit 726 may include data register 352, bit flipping circuit 754, syndrome generation circuit 356, H-matrix generation circuit 358 (not shown in FIG. 7), bit error detection circuit 760, correction circuit 762, and control circuit 764. Elements in FIG. 7 with the same annotations as elements in FIG. 3A are described above. The above discussion of bit flipping circuit 354, bit error detection circuit 360, control circuit 364, correction circuit 362, control signals 364a-c, and information 354a and 360a applies to bit flipping circuit 754, bit error detection circuit 760, control circuit 764, correction circuit 762, control signals 764a-c, and information 770a and 780a, respectively, unless mentioned otherwise.

In some embodiments, method 600 may be an operational flow of decoder circuits 126, 326, and/or 726. It should be noted that method 700 does not describe overall operation of decoder circuits 126, 326, and/or 726. Accordingly, it is understood that additional operations may be provided during method 600, and that some other operations may only be briefly described herein.

In referring to FIG. 6, in operation 602, a stored data is received from a memory device and provided to a syndrome generation circuit. For example, as shown in FIG. 7, codeword 126b may be received by data register 352 of decoder circuit 726 from memory array 102 and codeword 126b' equal to codeword 126b may be provided to syndrome generation circuit 356. In some embodiments, providing codeword 126b' equal to codeword 126b to syndrome generation circuit 356 may include initializing shift register 770 of bit flipping circuit 754 to zero, that is, setting all bits of shift register 770 to logical values of zero based on control signal 764a received from control circuit 764. The providing may further include performing a bitwise logical XOR operation between codeword 126b and n bits of shift register 770 as illustrated in FIG. 7. In some embodiments, shift register 570 may be a serial-in, parallel-out shift register having a bit length of n-bits.

In referring to FIG. 6, in operation 604, a syndrome of the received stored data is generated. For example, as shown in FIG. 7, syndrome 356a may be generated by syndrome generation circuit 356 based on codeword 126b received in operation 602 and on transposed H-matrix 358a received from H-matrix generation circuit 358 (shown in FIG. 3A). In some embodiments, the generation of syndrome 356a may include performing dot product between codeword 126b received in operation 602 and transposed H-matrix 358a based on equation (3) described above with reference to FIG. 3A. The generation may further include performing logical XOR operations between codeword 126b and transposed H-matrix 358a as described above with reference to FIGS. 3A and 3C.

In referring to FIG. 6, in operation 606, the generated syndrome of the received stored data is compared to zero. For example, as shown in FIG. 7, syndrome 356a may be provided to comparator 776 of bit error detection circuit 760. Comparator 776 may be configured to compare syndrome 356a to zero. In some embodiments, the comparing may include performing a logical OR operation of the n−k bits of syndrome 356a by comparator 776. If the output signal 760b of the logical OR operation is a logical value of zero, which indicates that syndrome 356a is equal to zero, then method 600 may proceed to operation 608. Otherwise, if the output signal 760b of the logical OR operation is a logical value of one, which indicates that syndrome 356a is not equal to zero, then method 600 may proceed to operation 610. In some embodiments, the equivalence of syndrome 356a to zero indicates that codeword 126b is error free and the non-equivalence of syndrome 356a to zero indicates that codeword 126b may have 1-bit or 2-bit errors. In some embodiments, in operation 606, comparator 778 may be disabled based on control signal 764b from control circuit 764 and n-bits of shift register 780 may be initialized to logical values of zero. In some embodiments, shift register 780 may be a parallel-in, parallel-out shift register having a bit length of n-bits.

In referring to FIG. 6, in operation 608, k-bit data of the received stored data is output. For example, as shown in FIG. 7, data 126a may be output by correction circuit 562. In some embodiments, the outputting of data 126a from correction circuit 762 may include performing a bitwise logical XOR operation between codeword 126b and the initialized n-bits of shift register 770 of operation 602 followed by separation of k-bit data portion of codeword 126b from the n−k-bit ECC portion of codeword 126b by circuit 772. The outputting may further include receiving signal 760b by control circuit 764 from bit error detection circuit 760 indicating that syndrome 356a is equal to zero followed by control circuit 764 providing control signal 764c to logic circuit 574. Control signal 5764c may enable logic circuit 774 to allow k-bit data portion from circuit 772 to be output from correction circuit 762.

In referring to FIG. 6, in operation 610, the generated syndrome of the received stored data is compared to a column of an H-matrix. For example, as shown in FIG. 7, syndrome 356a generated at operation 604 may be provided to comparator 778 of bit error detection circuit 760. Comparator 778 may be configured to compare syndrome 356a to each of n columns of H-matrix 358b. In some embodiments, control circuit 764 may control a counter (not shown) to sequentially output each column of H-matrix 358b to comparator 778. The counter may be coupled to control circuit 764 and H-matrix generation circuit 358. The comparison to each column may be done in parallel, that is simultaneously, or may be done in serial, that is one after another. In some embodiments, the comparing may include receiving control signal 764b from control circuit 764 to enable operation of comparator 778. Control signal 764b may be provided to comparator 778 in response to control circuit 764 receiving signal 760b indicating that syndrome 356a generated at operation 606 is not equal to zero.

The comparing may further include entering the output of each comparison result into each bit location of shift register 780. Each bit location of shift register 780 may correspond to each index of the columns of H-matrix 358b. For example, if syndrome 356a matches $n^{th}$ column of H-matrix 358*b*, then a logical value of one is output from comparator 778 and entered into $n^{th}$ bit location of shift register 780 and if syndrome 356*a* does not match $n^{th}$ column of H-matrix 358*b*, then a logical value of zero is output from comparator 778 and entered into $n^{th}$ bit location of shift register 780. The matching of syndrome 356*a* generated at operation 604 to a column of H-matrix 358*b* may indicate that codeword 126*b* has 1-bit error and the index of the matched column of H-matrix 358*b* indicates the location of the 1-bit error in codeword 126*b*. For example, if syndrome 356*a* matches $n^{th}$ column of H-matrix 358*b*, then the $n^{th}$ bit location of codeword 126*b* has a 1-bit error.

The comparing in operation 610 may further include performing a logical OR operation of then bits of shift register 780 by control circuit 764. If the output of the logical OR operation is a logical value of one, which indicates that at least one of the n bits of shift register 780 is equal to one, then method 600 may proceed to operation 612. Otherwise, if the output signal of the logical OR operation is a logical value of zero, which indicates that none of the n bits of shift register 780 is equal to zero, then method 600 may proceed to operation 616.

In referring to FIG. 6, in operation 612, 1-bit error of the received stored data is corrected. For example, as shown in FIG. 7, 1-bit error in codeword 126*b* may be corrected based on codeword 126*b* received from data register 352, on information 770*a* received from shift register 770, and on information 780*a* received from shift register 780 by correction circuit 762. In some embodiments, the correcting may include performing a first bitwise logical XOR operation between codeword 126*b* and the logical values of n-bits of shift register 770 at operation 610 followed by a second bitwise logical XOR operation between the logical values of n-bits of shift register 780 at operation 610 and the n-bit output of the first bitwise logical XOR operation. The second bitwise logical XOR operation may be followed by separation of k-bit data portion of the corrected codeword 126*b* from the n–k-bit ECC portion of the corrected codeword 126*b* by circuit 772.

In referring to FIG. 6, in operation 614, k-bit data of the 1-bit error corrected stored data is output. For example, as shown in FIG. 7, data 126*a* may be output by correction circuit 762. In some embodiments, the outputting of data 126*a* from correction circuit 762 may include receiving signal control signal 764*c* from control circuit 764 to enable logic circuit 774 to allow the separated k-bit data portion from circuit 772 to be output from correction circuit 762. Control signal 764*c* to enable logic circuit 774 may be triggered based on the logical OR operation of the n bits of shift register 780 in control circuit 764 outputting a logical value of one. In some embodiments, control signal 764*c* may be triggered to disable logic circuit 774 when control circuit 764 receives signal 360*b* from comparator 776 indicating that syndrome 356*a* generated at operation 606 is not equal to zero and the logical OR operation of the n bits of shift register 780 in control circuit 764 outputs a logical value of zero.

In referring to FIG. 6, in operation 616, a bit of the received stored data is flipped. For example, as shown in FIG. 7, a bit of codeword 126*b* may be flipped by bit flipping circuit 754 to output codeword 126*b*' that is different from codeword 126*b* by one bit. In some embodiments, the bit flipping may include performing a bitwise logical XOR operation (shown in FIG. 7) between codeword 126*b* and bits of shift register 770, where one of the bits of shift register 770 has a logical value of one and the other bits have logical values of zero. The location of the bit of shift register 770 having a logical value of one corresponds to the location of the bit of codeword 126*b* that may be flipped.

In some embodiments, operation 616 may be part of an iterative loop for determining the locations of 2-bit errors in codeword 126*b*. The iterative loop may comprise of operations 616-620. The first iteration may start with entering a logical value of one in the most significant bit (MSB) position of shift register 770 at operation 616. During each iteration, at operation 616, the logical value of one in shift register 770 may be shifted one bit position towards its least significant bit (LSB) position, while the rest of the bit positions of shift register 770 has logical values of zero. The last iteration may have the logical value of one in the LSB position of shift register 770 during operation 616. Accordingly, the first iteration of the iterative loop of operations 616-620 may start with the MSB of codeword 126*b* flipped at operation 616 and the last iteration of the iterative loop may have the LSB of codeword 126*b* flipped during operation 616. During each iteration, at operation 616, a consecutive bit of codeword 126*b* may be flipped corresponding to the bit position of the logical one in shift register 770. In some embodiments, the operation (e.g., shifting of the logical value of one) of shift register 770 may be based on control signal 764*a* from control circuit 764.

In referring to FIG. 6, in operation 618, a syndrome of the bit-flipped data is generated. For example, as shown in FIG. 7, syndrome 356*a* of codeword 126*b*' may be generated by syndrome generation circuit 356 based on codeword 126*b*' output at operation 616 and on transposed H-matrix 358*a* received from H-matrix generation circuit 358 (shown in FIG. 3A).). In some embodiments, the generation of syndrome 356*a* may include performing dot product between codeword 126*b*' output in operation 616 and transposed H-matrix 358*a* based on equation (3) described above with reference to FIG. 3A. The generation may further include performing logical XOR operations between codeword 126*b*' and transposed H-matrix 358*a* as described above with reference to FIGS. 3A and 3C.

In referring to FIG. 6, in operation 620, the generated syndrome of the bit-flipped data is compared to a column of the H-matrix. For example, as shown in FIG. 7, syndrome 356*a* generated at operation 618 may be provided to comparator 778 that may be configured to compare syndrome 356*a* to each of n columns of H-matrix 358*b*. The comparison to each column may be done in parallel, that is simultaneously, or may be done in serial, that is one after another. The comparing may include entering the output of each comparison result into each bit location of shift register 780. Each bit location of shift register 780 may correspond to each index of the columns of H-matrix 358*b*. For example, if syndrome 356*a* generated at operation 618 matches $n^{th}$ column of H-matrix 358*b*, then a logical value of one is output from comparator 778 and entered into $n^{th}$ bit location of shift register 780 and if syndrome 356*a* generated at operation 618 does not match $n^{th}$ column of H-matrix 358*b*, then a logical value of zero is output from comparator 778 and entered into $n^{th}$ bit location of shift register 780. The comparing in operation 620 may further include performing a logical OR operation of the n bits of shift register 780 by control circuit 764. If the output of the logical OR operation is a logical value of one, which indicates that at least one of the n bits of shift register 780 is equal to one, then method 600 may proceed to operation 622. Otherwise, if the output signal of the logical OR operation is a logical value of zero, which indicates that none of the n bits of shift register 780 is equal to zero, then method 600 may proceed to operation 616.

The matching of syndrome 356a generated at operation 618 to a column of H-matrix 358b may indicate that codeword 126b has 2-bit error and the index of the matched column of H-matrix 358b indicates one of the location of the 2-bit errors in codeword 126b. For example, if syndrome 356a generated at operation 618 matches $n^{th}$ column of H-matrix 358b, then the $n^{th}$ bit location of codeword 126b has one of the bit errors of a 2-bit error. The other location of the 2-bit error in codeword 126b may be provided by the flipped bit location in codeword 126b' based on which syndrome 356a that matches a column of H-matrix 358b in operation 620 was generated in operation 618.

In some embodiments, the mismatch between syndrome 356a generated at operation 618 and any columns of H-matrix 358b indicates that the flipped bit location of codeword 126b' that is output at operation 616 is not one of the locations of the 2-bit errors in codeword 126b. In this mismatch situation, another iteration of the iterative loop of operations 616-620 may be performed. The iterations of the iterative loop may be performed until syndrome 356a generated at operation 618 is found to match one of the n columns of H-matrix 358b at operation 620. If syndrome 356a generated at operation 618 is not found to match one of the columns of H-matrix 358b at operation 620 after n number of iterations of the iterative loop, bit error detection circuit 760 may provide signal 360b to control circuit 764 indicating that codeword 126b has uncorrectable 3-bit errors.

In referring to FIG. 6, in operation 622, a 2-bit error of the received stored data is corrected. For example, as shown in FIG. 7, 2-bit error in codeword 126b may be corrected based on codeword 126b received from data register 352, on information 770a received from shift register 770, and on information 780a received from shift register 780 by correction circuit 762. In some embodiments, the correcting may include performing a first bitwise logical XOR operation between codeword 126b and the logical values of n-bits of shift register 770 at operation 620 followed by a second bitwise logical XOR operation between the logical values of n-bits of shift register 780 at operation 620 and the n-bit output of the first bitwise logical XOR operation. The second bitwise logical XOR operation may be followed by separation of k-bit data portion of the corrected codeword 126b from the n–k-bit ECC portion of the corrected codeword 126b by circuit 772.

In referring to FIG. 6, in operation 624, k-bit data of the 2-bit error corrected stored data is output. For example, as shown in FIG. 7, data 126a may be output by correction circuit 762. In some embodiments, the outputting of data 126a from correction circuit 762 may include receiving signal control signal 764c from control circuit 764 to enable logic circuit 774 to allow the separated k-bit data portion from circuit 772 to be output from correction circuit 762. Control signal 764c to enable logic circuit 774 may be triggered based on the logical OR operation of the n bits of shift register 780 in control circuit 764 outputting a logical value of one.

It should be understood that intersecting lines of FIGS. 1, 2A-2B, 3A-3C, and 4-8 are not electrically connected unless the intersection point is illustrated with a node that is represented by a solid black circle ("•").

Figure 8:
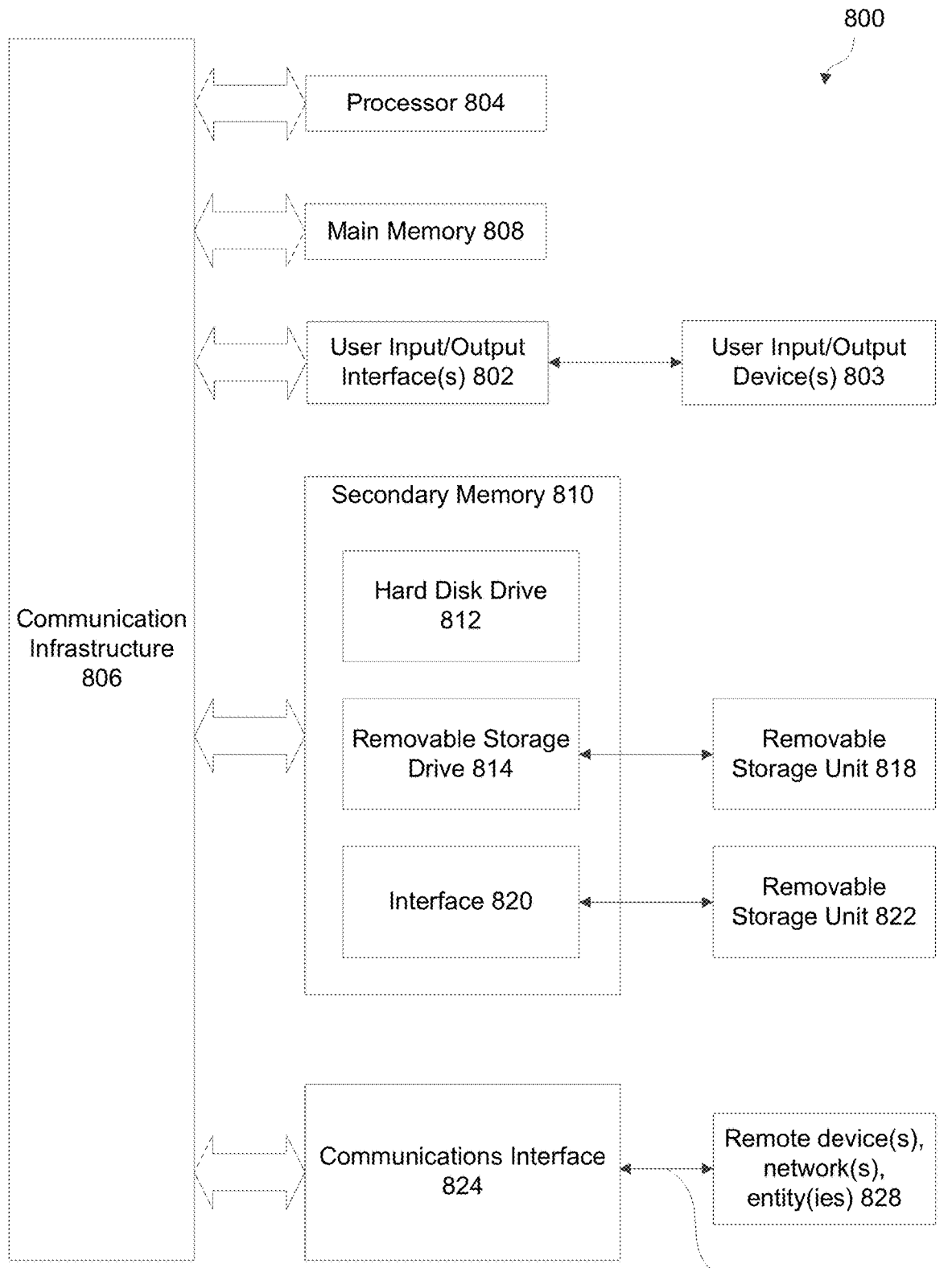
FIG. 8 illustrates a block diagram of a computer system in which embodiments of the present invention, or portions thereof, may be implemented, in accordance with some embodiments.

Various aspects of the present invention may be implemented in software, firmware, hardware, or a combination thereof. FIG. 8 is an illustration of a computer system 800 in which various embodiments of the present disclosure, or portions thereof, can be implemented, according to some embodiments. For example, the methods 400 and 600 illustrated by flowcharts of FIGS. 4 and 6, respectively, can be implemented in system 800. It should be noted that the simulation, synthesis and/or manufacture of various embodiments of the present invention may be accomplished, in part, through the use of computer readable code, including general programming languages (such as C or C++), hardware description languages (HDL) such as, for example, Verilog HDL, VHDL, Altera HDL (AHDL), or other available programming and/or schematic capture tools (such as circuit capture tools). This computer readable code can be disposed in any known computer-usable medium including a semiconductor, magnetic disk, optical disk (such as CD-ROM, DVD-ROM). As such, the code can be transmitted over communication networks including the Internet.

Computer system 800 can be any well-known computer capable of performing the functions and operations described herein. Computer system 800 includes one or more processors (also called central processing units, or CPUs), such as a processor 804. Processor 804 is connected to a communication infrastructure or bus 806. Computer system 800 also includes input/output device(s) 803, such as monitors, keyboards, pointing devices, etc., that communicate with communication infrastructure or bus 806 through input/output interface(s) 802. An EDA tool can receive instructions to implement functions and operations described herein—e.g., methods 400 and/or 600 of FIGS. 4 and/or 6, respectively,—via input/output device(s) 803. Computer system 800 also includes a main or primary memory 808, such as random access memory (RAM). Main memory 808 can include one or more levels of cache. Main memory 808 has stored therein control logic (e.g., computer software) and/or data. In some embodiments, the control logic (e.g., computer software) and/or data can include one or more of the operations described above with respect to methods 400 and/or 600 of FIGS. 4 and/or 6, respectively.

Computer system 800 can also include one or more secondary storage devices or memory 810. Secondary memory 810 can include, for example, a hard disk drive 812 and/or a removable storage device or drive 814. Removable storage drive 814 can be a floppy disk drive, a magnetic tape drive, a compact disk drive, an optical storage device, tape backup device, and/or any other storage device/drive.

Removable storage drive 814 can interact with a removable storage unit 818. Removable storage unit 818 includes a computer usable or readable storage device having stored thereon computer software (control logic) and/or data. Removable storage unit 818 can be a floppy disk, magnetic tape, compact disk, DVD, optical storage disk, and/any other computer data storage device. Removable storage drive 814 reads from and/or writes to removable storage unit 818.

According to some embodiments, secondary memory 810 can include other means, instrumentalities or other approaches for allowing computer programs and/or other instructions and/or data to be accessed by computer system 800. Such means, instrumentalities or other approaches can include, for example, a removable storage unit 822 and an interface 820. Examples of the removable storage unit 822 and the interface 820 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 810, removable storage unit 818, and/or removable storage unit 822 can include one or more of the operations described above with respect to methods 400 and/or 600 of FIGS. 4 and/or 6, respectively.

Computer system 800 can further include a communication or network interface 824. Communication interface 824 enables computer system 800 to communicate and interact with any combination of remote devices, remote networks, remote entities, etc. (individually and collectively referenced by reference number 828). For example, communication interface 824 can allow computer system 800 to communicate with remote devices 828 over communications path 826, which can be wired and/or wireless, and which can include any combination of LANs, WANs, the Internet, etc. Control logic and/or data can be transmitted to and from computer system 800 via communication path 826. Communications path 826 carries signals and can be implemented using wire or cable, fiber optics, a phone line, a cellular phone link, a RF link or other communications channels.

The operations in the preceding embodiments can be implemented in a wide variety of configurations and architectures. Therefore, some or all of the operations in the preceding embodiments—e.g., methods 400 and/or 600 of FIGS. 4 and/or 6, respectively—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 800, main memory 808, secondary memory 810 and removable storage units 818 and 822, as well as tangible articles of manufacture embodying any combination of the foregoing. Such control logic, when executed by one or more data processing devices (such as computer system 800), causes such data processing devices to operate as described herein. In particular, the control logic or computer programs, when executed, enable processor 804 to implement processes of embodiments of the present invention, such as the steps in methods 400 and/or 600 of FIGS. 4 and/or 6, respectively. Where embodiments of the present invention are implemented using software, the software can be stored in a computer program product and loaded into computer system 800 using removable storage drive 814, interface 820, hard drive 812, or communications interface 824.

In some embodiments, computer system 800 is installed with software to perform operations as illustrated in methods 400 and/or 600 of FIGS. 4 and/or 6, respectively. In some embodiments, computer system 800 includes hardware/equipment for the manufacturing of photomasks and circuit fabrication. For example, the hardware/equipment can be connected to or be part of element 828 (remote device(s), network(s), entity(ies)) of computer system 800.

The above embodiments describe systems and methods for the detection and correction of single and multi-bit errors in memory devices that help to overcome the above discussed problems in current ECC-based data storage systems. The example ECC-based methods disclosed herein help to reduce the complexity of logic circuitry used for the implementation of the disclosed example ECC-based bit error detection and correction (BEDC) circuits in data storage systems. For example, the example methods disclosed herein for bit error detection uses a bit flipping scheme to determine the location(s) of bit error(s) in corrupted data. This bit flipping scheme helps to keep the logic circuitry of the BEDC circuits as simple as possible so as to avoid errors that may occur in the circuit and also to be able to operate the logic circuitry as quickly as possible for faster bit error detection and correction compared to current bit error detection and correction methods. Lowering the complexity of the logic circuitry helps to reduce the number of devices used in the implementation of the logic circuitry, and consequently, helps to reduce the integrated circuit layout area, power consumption, propagation delays, and processing times of the logic circuitry compared to current ECC-based BEDC circuits. In some embodiments, the processing times required for the operations of the example ECC-based BEDC circuits may be reduced by about 10% to about 50% compared to processing times of current ECC-based BEDC circuits.

In some embodiments, a method of correcting one or more bit errors in a memory device includes retrieving a codeword from a memory device. The codeword includes a data and an error correcting code. The method further includes determining whether the one or more bit errors are present in the retrieved codeword and correcting the retrieved codeword for the one bit error in response to determining one bit error is present in the retrieved codeword. The method also includes flipping a bit of the retrieved codeword in response to determining a plurality of bit errors is present in the retrieved codeword and correcting the retrieved codeword for the plurality of bit errors based on the bit-flipped codeword.

In some embodiments, a method of correcting a one bit error in a memory device includes retrieving a codeword from a memory device. The codeword includes a data and an error correcting code. The method further includes determining whether the one bit error is present in the retrieved codeword, flipping a bit of the retrieved codeword in response to determining the one bit error is present in the retrieved codeword, and correcting the retrieved codeword for the one bit error based on the bit-flipped codeword.

In some embodiments, a data storage system includes a memory array configured to store a codeword having a data and an error correction code, an encoder circuit configured to encode the data with the error correction code to form the codeword during a write mode operation of the memory array, and a decoder circuit. The decoder circuit includes a data register configured to retrieve the codeword during a read mode operation of the memory array, a bit error detection circuit configured to whether one or more bit errors are present in the retrieved codeword, a bit flipping circuit configured to flip a bit of the retrieved codeword in response to a plurality of bit errors being present in the retrieved codeword, and a correction circuit configured to correct the retrieved codeword for the plurality of bit errors based on the bit-flipped codeword.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of correcting one or more bit errors in a memory device, the method comprising:
    retrieving a codeword from a memory device, the retrieved retrieved codeword having a data and an error correction code;
    determining whether a first bit error is present in the retrieved codeword;
    correcting the retrieved codeword, using a first logic circuit, for the first bit error in response to determining that the first bit error is present in the retrieved codeword;
    determining whether a second bit error is present in the retrieved codeword;
    flipping a bit of the retrieved codeword, using a second logic circuit, to determine a location of the second bit error in response to determining that the second bit error is present in the retrieved codeword; and
    correcting, using the first logic circuit, the retrieved codeword for the second bit error based on the bit-flipped codeword.

2. The method of claim 1, wherein the determining whether the first bit error is present comprises:
    generating a syndrome of the retrieved codeword; and
    comparing the syndrome with a predetermined value.

3. The method of claim 1, wherein the correcting the retrieved codeword for the first bit error comprises:
    generating a syndrome of the retrieved codeword;
    comparing the syndrome with one or more columns of an H-matrix that is generated based on the data of the retrieved codeword;
    storing results of the comparing as logical bits in a shift register; and
    performing a bitwise logical XOR operation between the retrieved codeword and the stored logical bits of the shift register.

4. The method of claim 1, wherein the flipping the bit of the retrieved codeword comprises:
    storing a logical value of one in a bit location of a first shift register, the bit location corresponding to a location of the bit of the retrieved codeword to be flipped; and
    performing a bitwise logical XOR operation between the retrieved codeword and bits of the first shift register.

5. The method of claim 4, wherein the correcting the retrieved codeword for the second bit error comprises:
    generating a syndrome of the bit-flipped codeword;
    comparing the syndrome with one or more columns of an H-matrix that is generated based on the data of the retrieved codeword;
    storing results of the comparing as logical bits in a second shift register; and
    performing a bitwise logical XOR operation between the retrieved codeword, the bits of the first shift register, and the stored logical bits of the second shift register.

6. The method of claim 1, further comprising separating data bits and error correcting code bits of the retrieved codeword that is corrected for the first bit error or the second bit error.

7. The method of claim 6, further comprising enabling a third logic circuit to output the separated data bits of the retrieved codeword that is corrected for the first bit error or the second bit error.

8. The method of claim 7, wherein the enabling comprises:
    generating a control signal in response to determining an absence of bit errors in the retrieved codeword or in response to determining a location of the first bit error or the location of the second bit error in the retrieved codeword; and
    receiving the control signal by the third logic circuit.

9. The method of claim 1, further comprising enabling a third logic circuit to output the data of the retrieved codeword in response to determining an absence of bit errors in the retrieved codeword.

10. A method of correcting a one bit error in a memory device, the method comprising:
    retrieving a codeword from a memory device, the retrieved codeword having data and an error correcting code;
    determining whether the one bit error is present in the retrieved codeword;
    flipping a bit of the retrieved codeword, using a first logic circuit, to determine a location of the one bit error in response to determining that the one bit error is present in the retrieved codeword; and
    correcting, using a second logic circuit, the retrieved codeword for the one bit error based on the bit-flipped codeword, wherein the correcting the retrieved codeword comprises:
        generating a syndrome of the bit-flipped codeword; and
        comparing the syndrome with a predetermined value.

11. The method of claim 10, wherein the determining whether the one bit error is present comprises:
    generating a syndrome of the retrieved codeword; and
    comparing the syndrome with a predetermined value.

12. The method of claim 10, wherein the flipping the bit of the retrieved codeword comprises:
    storing a logical value of one in a bit location of a shift register, the bit location corresponding to a location of the bit of the retrieved codeword to be flipped; and
    performing a bitwise logical XOR operation between the retrieved codeword and bits of the shift register.

13. The method of claim 12, wherein the correcting the retrieved codeword for the one bit error comprises:
    performing a bitwise logical XOR operation between the retrieved codeword and the bits of the shift register.

14. The method of claim 10, further comprising separating data bits and error correcting code bits of the corrected codeword.

15. The method of claim 14, further comprising enabling a third logic circuit to output the data of the retrieved codeword in response to determining absence of the one bit error in the retrieved codeword.

16. A data storage system, comprising:
    a memory array configured to store a codeword having a data and an error correction code;
    an encoder circuit configured to encode the data with the error correction code to form the codeword during a write mode operation of the memory array; and
    a decoder circuit comprising:
        a data register configured to retrieve the codeword during a read mode operation of the memory array;
        a bit error detection circuit configured to determine whether a single bit error or a plurality of bit errors are present in the retrieved codeword;
        a bit flipping circuit configured to flip a bit of the retrieved codeword to determine a location of a bit error in response to the plurality of bit errors being present in the retrieved codeword; and
        a correction circuit configured to correct the retrieved codeword for the plurality of bit errors based on the bit-flipped codeword.

17. The data storage system of claim 16, wherein the decoder circuit further comprises a syndrome generation circuit configured to generate a syndrome of the retrieved codeword; and wherein the bit error detection circuit is configured to determine whether the single bit error or the plurality of bit errors are present in the retrieved codeword based on the syndrome.

18. The data storage system of claim 17, wherein the bit error detection circuit comprises a logic OR gate configured to determine whether the syndrome is equal to a value of zero.

19. The data storage system of claim 16, wherein the bit flipping circuit comprises a plurality of logic XOR gates configured to flip the bit of the retrieved codeword.

20. The data storage system of claim 16, wherein the bit error detection circuit comprises a comparator configured to determine a location of the single bit error in the retrieved codeword in response to the single bit error being present in the retrieved codeword.

\* \* \* \* \*